United States Patent
Bolognia

(10) Patent No.: US 9,466,594 B2
(45) Date of Patent: Oct. 11, 2016

(54) COMPACT SENSOR MODULE

(71) Applicant: ANALOG DEVICES, INC., Norwood, MA (US)

(72) Inventor: David Frank Bolognia, North Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/478,810

(22) Filed: Sep. 5, 2014

(65) Prior Publication Data

US 2015/0061043 A1 Mar. 5, 2015

Related U.S. Application Data

(63) Continuation of application No. 13/405,594, filed on Feb. 27, 2012, now Pat. No. 8,829,454.

(51) Int. Cl.
| | | |
|---|---|---|
| *G01T 1/16* | (2006.01) | |
| *G01T 1/24* | (2006.01) | |
| *H01L 25/16* | (2006.01) | |
| *H01L 31/024* | (2014.01) | |
| *H01L 31/115* | (2006.01) | |
| *H01L 27/146* | (2006.01) | |

(52) U.S. Cl.
CPC ............... *H01L 25/165* (2013.01); *G01T 1/16* (2013.01); *G01T 1/24* (2013.01); *H01L 27/14618* (2013.01); *H01L 31/024* (2013.01); *H01L 31/115* (2013.01); *H01L 2924/0002* (2013.01)

(58) Field of Classification Search
CPC .................................... G01T 1/16; G01T 1/24
See application file for complete search history.

(56) References Cited

U.S. PATENT DOCUMENTS

| | | | |
|---|---|---|---|
| 4,883,967 A | 11/1989 | Tsutsui et al. | |
| 6,323,891 B1 * | 11/2001 | Kitani | G01T 1/2018 257/713 |
| 6,396,898 B1 | 5/2002 | Saito et al. | |
| 6,510,195 B1 * | 1/2003 | Chappo | G01T 1/2018 250/208.1 |
| 6,573,506 B2 | 6/2003 | Sato et al. | |
| 7,067,817 B2 | 6/2006 | Suganuma et al. | |
| 7,358,501 B2 | 4/2008 | Danzer et al. | |
| 7,468,514 B1 | 12/2008 | Suzuki et al. | |
| 7,504,637 B2 | 3/2009 | Thorne | |
| 7,544,947 B2 | 6/2009 | Kerwin et al. | |

(Continued)

FOREIGN PATENT DOCUMENTS

JP  2002-022841  1/2002

OTHER PUBLICATIONS

Extended Search Report mailed May 26, 2015 in European Application No. 13755853.2 filed Aug. 4, 2014 in 6 pages.

(Continued)

*Primary Examiner* — Casey Bryant
(74) *Attorney, Agent, or Firm* — Knobbe, Martens, Olson & Bear, LLP

(57) ABSTRACT

A compact sensor module and methods for forming the same are disclosed herein. In some embodiments, a sensor die is mounted on a sensor substrate. A processor die can be mounted on a flexible processor substrate. In some arrangements, a thermally insulating stiffener can be disposed between the sensor substrate and the flexible processor substrate. At least one end portion of the flexible processor substrate can be bent around an edge of the stiffener to electrically couple to the sensor substrate 19 Claims, 19 Drawing Sheets

(56) References Cited

U.S. PATENT DOCUMENTS

| | | |
|---|---|---|
| 8,829,454 B2 | 9/2014 | Bolognia |
| 2002/0011572 A1* | 1/2002 | Kajiwara .......... H01L 27/14623 |
| | | 250/370.11 |
| 2003/0010924 A1 | 1/2003 | El-Hanany et al. |
| 2003/0097875 A1 | 5/2003 | Lentz et al. |
| 2004/0223583 A1 | 11/2004 | Tsujii |
| 2005/0029463 A1 | 2/2005 | Kaemmerer |
| 2005/0067178 A1 | 3/2005 | Pearson et al. |
| 2005/0285973 A1 | 12/2005 | Singh et al. |
| 2006/0223227 A1 | 10/2006 | Kubota et al. |
| 2007/0221859 A1 | 9/2007 | Nakata |
| 2008/0011959 A1 | 1/2008 | Thorne |
| 2008/0283764 A1 | 11/2008 | Kerwin |
| 2009/0084971 A1* | 4/2009 | Ohta .................... A61B 6/0414 |
| | | 250/370.15 |
| 2010/0078565 A1 | 4/2010 | Tsubota et al. |
| 2010/0224785 A1* | 9/2010 | Chiyoma .............. G01T 1/2018 |
| | | 250/369 |
| 2011/0133939 A1 | 6/2011 | Ranganathan et al. |
| 2011/0272588 A1* | 11/2011 | Jadrich .................... G01T 1/20 |
| | | 250/370.11 |
| 2012/0097857 A1* | 4/2012 | Hayatsu ................ G01T 1/2018 |
| | | 250/366 |
| 2014/0027637 A1* | 1/2014 | Watano .................... G01T 1/16 |
| | | 250/336.1 |

OTHER PUBLICATIONS

Office Action mailed Oct. 30, 2014 issued in U.S. Appl. No. 13/708,727, filed Dec. 7, 2012, 12 pages.

Cesmeli, Erdogan Ph.D., "V-Res—Detecting the Difference in Volume CT," GE Healthcare Publication.

Maloney, Lawrence D., "Close Cooperation Among a Global Engineering Team Led to the Success of the Lightspeed VCT Medical Scanner," Test & Measurement World Aug. 2005.

International Search Report and Written Opinion of the International Search Authority in PCT/US2013/027643, dated Jun. 24, 2012, 12 pages.

Dec. 30, 2015 Office Action from related Chinese App. No. 201380011120.5.

* cited by examiner

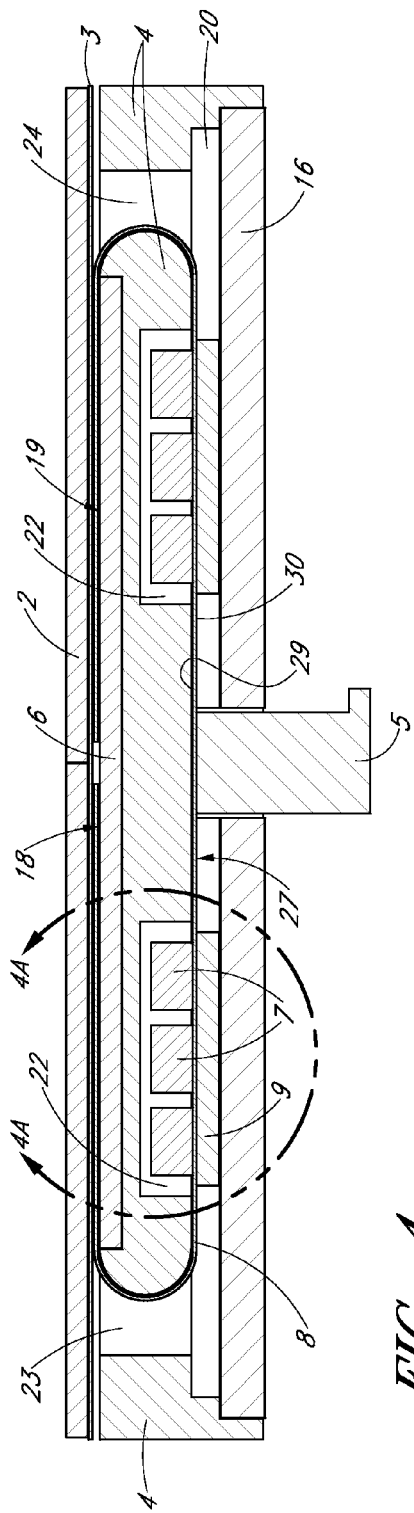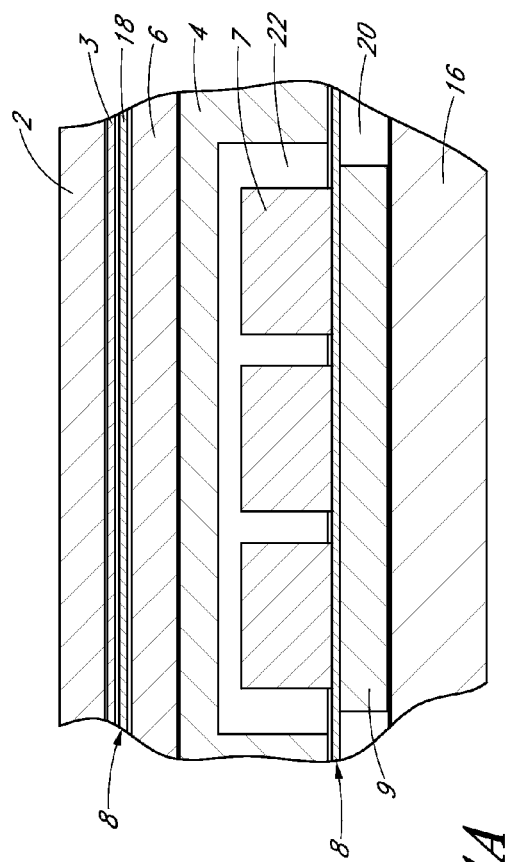
FIG. 4
FIG. 4A

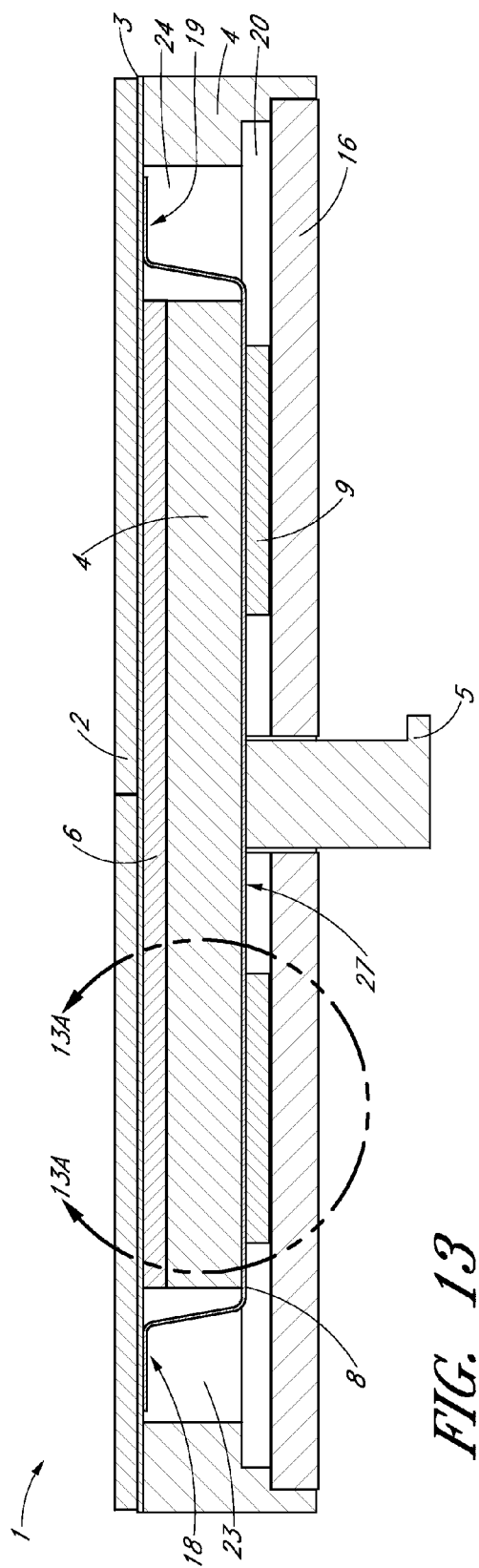
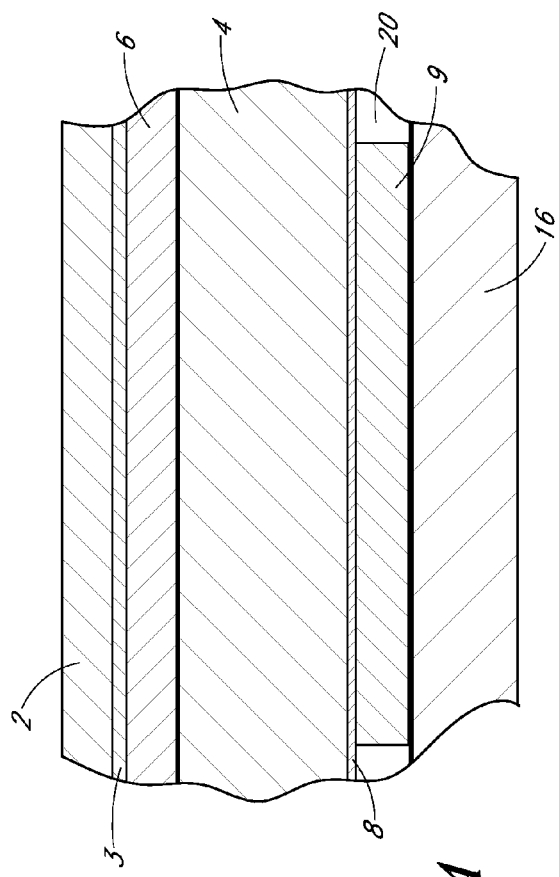
FIG. 13
FIG. 13A

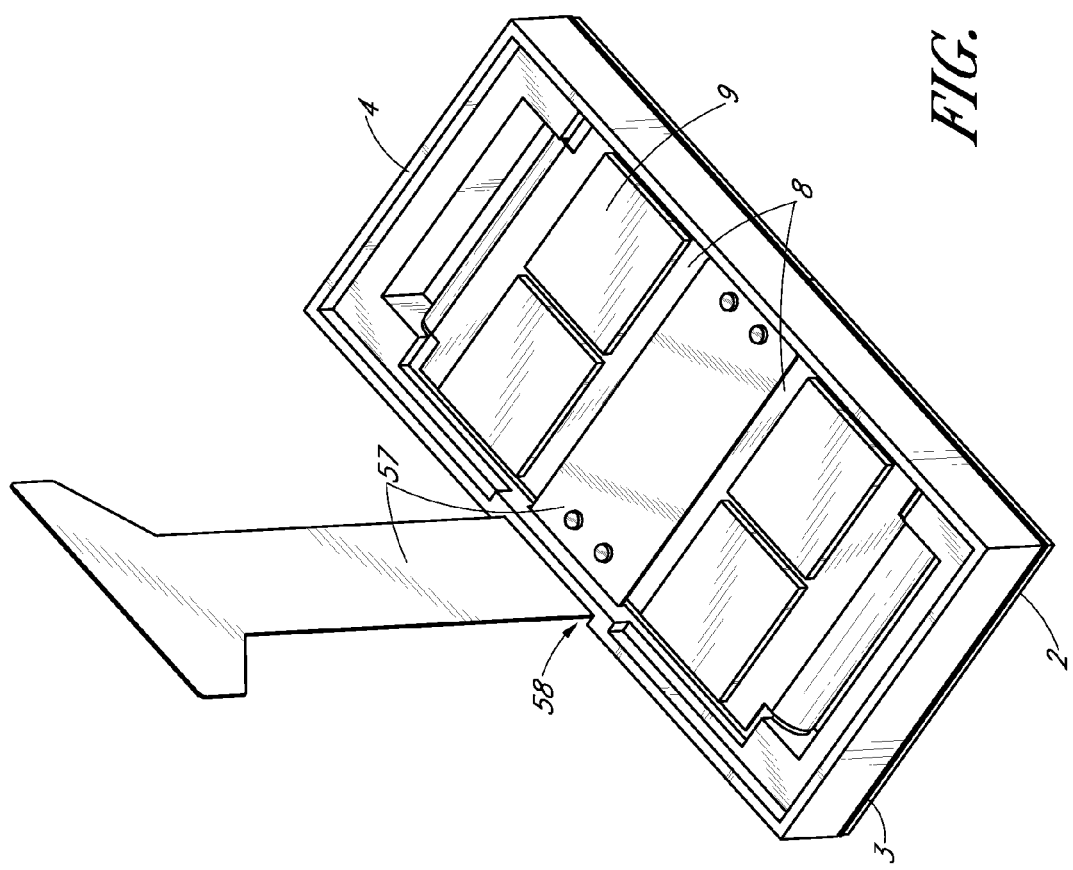

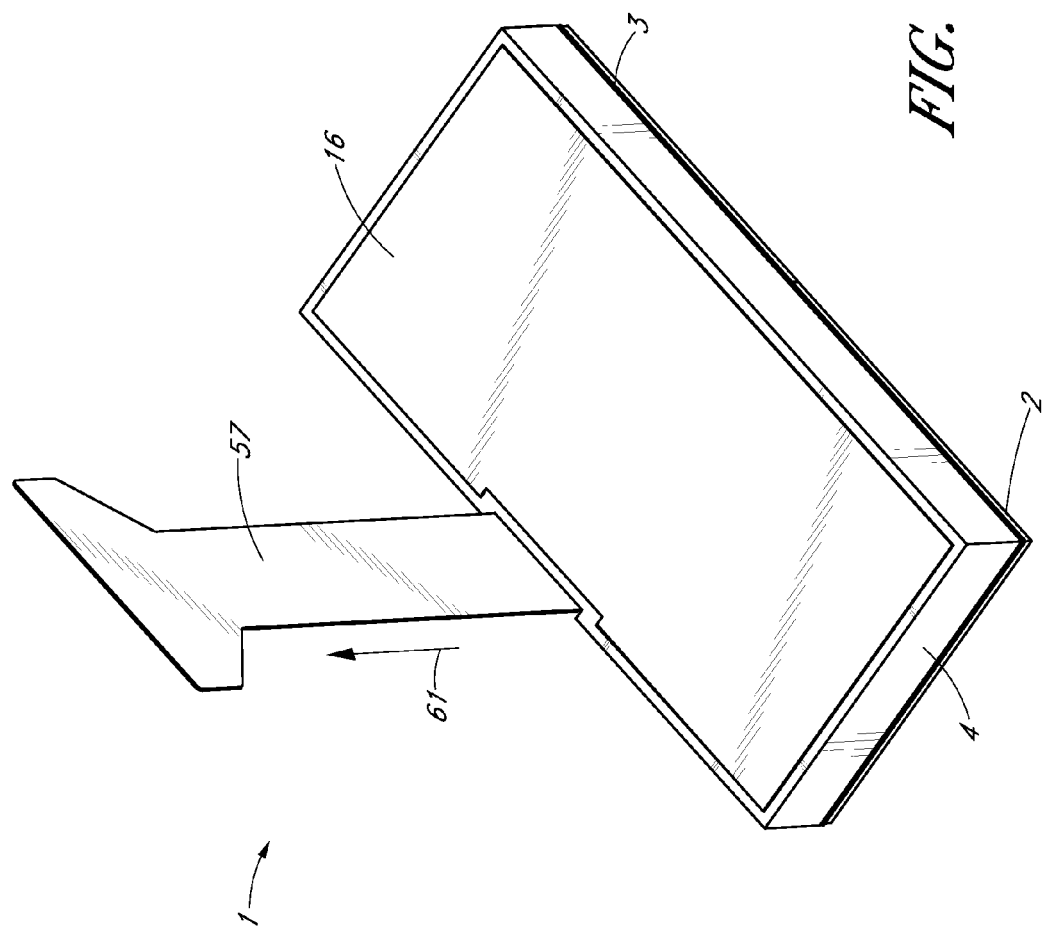

COMPACT SENSOR MODULE

CROSS-REFERENCE TO RELATED APPLICATIONS

This application is a continuation of U.S. patent application Ser. No. 13/405,594, filed Feb. 27, 2012, and entitled "COMPACT SENSOR MODULE," the contents of which are incorporated by reference herein in their entirety and for all purposes.

BACKGROUND OF THE INVENTION

1. Field of the Invention

The field of the invention relates generally to a sensor module including a sensor and processing electronics.

2. Description of the Related Art

Sensor modules that include both a sensor and a processor (e.g., a general purpose processor or an Application-Specific Integrated Circuit, or ASIC) can be useful in a variety of optical, electrical, and electronic applications. In some implementations, it can be desirable to arrange the sensor module so that the sensor and processor are positioned relatively close to one another. For example, analog signals can experience parasitic losses as the signals are transmitted over a distance, which can degrade the accuracy and quality of the detected signal. Positioning the sensor near the processor can reduce or eliminate parasitic losses associated with signal transmission between the sensor and the processor. The processor can then perform various preconditioning and/or preprocessing operations, such as converting analog signals to digital signals, within the sensor module. The processor can transmit the processed digital signals to an external control module, which can be located far from the sensor, with minimal or no parasitic transmission losses to the signals.

One problem associated with positioning the processor near the sensor is that the heat generated by the processor may be transmitted to the sensor or the sensor substrate. It can be undesirable to transmit heat to the sensor for a variety of reasons. For example, the heat can cause damage due to a mismatch of the thermal coefficients among the parts. Heating the sensor can also be undesirable by inducing increased temperatures on the sensor that can damage sensor components or that can interfere with the signals detected by the sensor. Therefore, while it can be advantageous to position the processor near the sensor to improve the quality of the signals detected and transmitted from the sensor, it is also important in some implementations to prevent the sensor from overheating due to operation of the nearby processor.

Another consideration when designing sensor modules is ensuring that the sensor module (e.g., including the sensor and the processor) is compact or small enough to comply with the overall system design requirements, which can be important whether the modules are employed individually or are assembled in an array. For example, in some arrangements, an array of sensor modules is used to detect signals received in various locations or at different angles. In some applications, an array of sensor modules can be used for imaging applications, such as for x-ray detection in a computed tomography (CT) device. The array can be a one-dimensional string or a two-dimensional (2D) array. CT devices can be used in a variety of applications, including medical imaging, industrial imaging, nondestructive testing, imaging subsurface minerals, and various other uses. Because the sensor modules are positioned adjacent one another in the array in some implementations, the sensor, the processor, and other components must fit within their associated area in the array. Moreover, because there are neighboring sensor modules on each side of a particular sensor module, it is important to design transmission elements connecting the sensor module to the external control module so that they do not interfere with neighboring sensor modules. In other imaging applications, sensor modules can be used to detect sound waves within an ultrasound system. In yet other implementations, sensor modules can be employed in nuclear imaging applications, such as in positron emission tomography (PET) scans and gamma ray imaging applications. In nuclear imaging applications, a sensor (or sensor array in some embodiments) can be used to image an object (e.g., a patient) that has been provided with (e.g., ingested or been injected with) a radioactive tracer material.

Accordingly, it can be advantageous to provide a compact sensor module that positions the sensor close to processing electronics while ensuring that the sensor and/or sensor substrate is sufficiently insulated from heat generated by the processing electronics.

SUMMARY OF THE INVENTION

In one embodiment, a sensor module is disclosed. The sensor module can comprise a sensor substrate and a sensor die mounted on the sensor substrate. The sensor module can further comprise a flexible processor substrate having a mounting portion and at least one end portion extending from the mounting portion. A processor die can be mounted on the mounting portion of the flexible processor substrate. A thermally insulating stiffener can be disposed between the sensor substrate and the mounting portion of the flexible processor substrate. The end portion of the flexible processor substrate can be bent around an edge of the stiffener to electrically couple to the sensor substrate.

In another embodiment, a method for forming a sensor module is disclosed. The method can comprise providing a sensor substrate, a flexible processor substrate, and a thermally insulating stiffener having a first side and a second side opposite the first side. The method can further include mounting a sensor die to the sensor substrate and mounting a processor die to the flexible processor substrate. In addition, the method can comprise attaching the flexible processor substrate to the second side of the stiffener. A first end portion of the flexible processor substrate can be bent at an edge of the stiffener. The method can also comprise electrically coupling the first end portion of the flexible processor substrate to the sensor substrate. The first side of the stiffener can face the sensor substrate.

BRIEF DESCRIPTION OF THE DRAWINGS

FIG. 4 is a side cross-sectional view of the assembled sensor module of FIG. 2.

FIG. 4A is an enlarged cross-sectional view of a portion of the sensor module illustrated in FIG. 4.

FIG. 13 is a side cross-sectional view of the assembled sensor module of FIG. 11.

FIG. 13A is an enlarged cross-sectional view of a portion of the sensor module illustrated in FIG. 13.

FIGS. 19A-D are bottom perspective views of various components of a sensor module, according to another embodiment.

DETAILED DESCRIPTION OF THE PREFERRED EMBODIMENT

Figure 1:
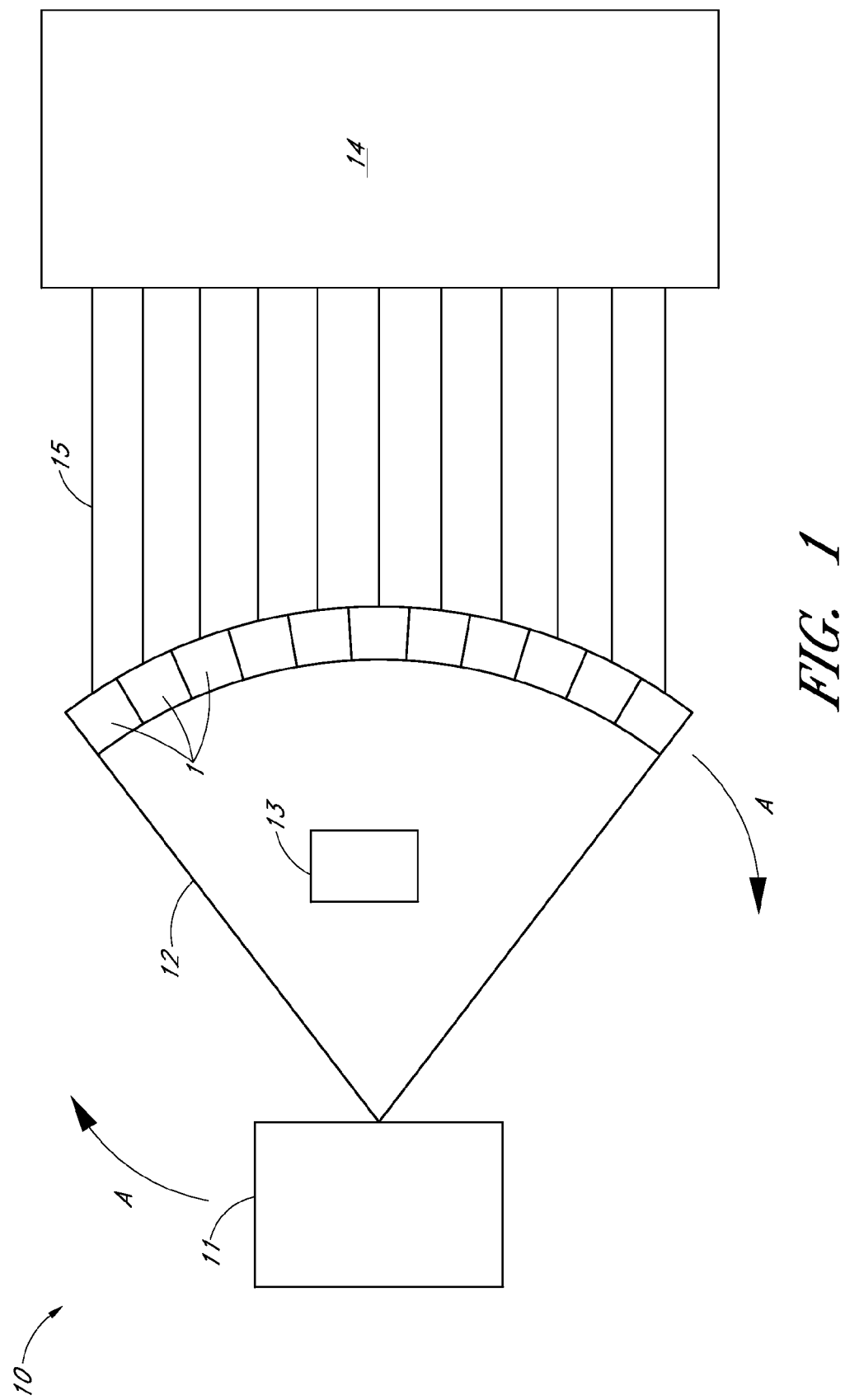
FIG. 1 is a top plan view of an array of sensor modules for a CT device according to one embodiment.

FIG. 1 illustrates an imaging system 10 according to one embodiment. In some implementations, the imaging system 10 can be a CT device. CT devices are useful in a variety of fields, including medical imaging, industrial imaging, non-destructive testing, and subsurface imaging. In the imaging system 10 of FIG. 1, a source 11 can emit radiation 12 in the direction of an object 13 (e.g., a patient) to be imaged. In one embodiment, the source 11 emits x-ray radiation. Skilled artisans will understand that there are various conventional mechanisms to emit radiation for imaging purposes. After some portion of the radiation 12 passes through the object 13, it reaches a one-dimensional (1D) or two-dimensional (2D) array of sensor modules 1 positioned opposite the source 11. The sensor modules 1 can be configured to convert visible light to electrical signals using a photodiode array (PDA), which can be the sensor of this imaging example. In some implementations, the sensor module 1 may also be configured to convert detected x-ray radiation to visible light, or the system 10 can include a separate scintillator for that purpose. The sensor module 1 is also configured to convert the analog signals received from the PDA into digital signals that can be transmitted by transmission elements 15 to an external control module 14. The sensor module 1 can also perform various other preprocessing and/or preconditioning operations on the detected signals before transmission to the control module 14. After the processed digital signals are received by the control module 14, the control module 14 can further process the digital signals into a readable output, such as an image on a display device or a report of various measured values calculated from the received signals. To obtain a full 3D image of the object 13, the system 10 can rotate around the object 13 in the direction A shown in FIG. 1 to obtain images of the subject 13 at various angles.

In other embodiments, the imaging system can be an ultrasound device. Although an ultrasound device is not expressly illustrated herein, it should be appreciated that an ultrasound device, according to some embodiments, can include a source of ultrasonic waves and a detector (or detector array) that includes one or more sensor modules similar to those described in more detail below. Furthermore, the sensor module(s) can be used in nuclear imaging implementations, such as PET scans and gamma ray imaging techniques. In yet other embodiments, the sensor modules can be used in various non-imaging arrangements, e.g., electrical, electronic, or optical applications that employ a compact module that includes both a sensor and a processor. For example, microelectromechanical systems (MEMS) devices, such as MEMS microphones and accelerometers, may include both a sensor die and a processor die near the sensor in order to process signals from the sensor. In these embodiments, sensor modules similar to those illustrated herein may be useful in providing a compact sensor package, while thermally insulating the sensor from the processor.

Figure 2:
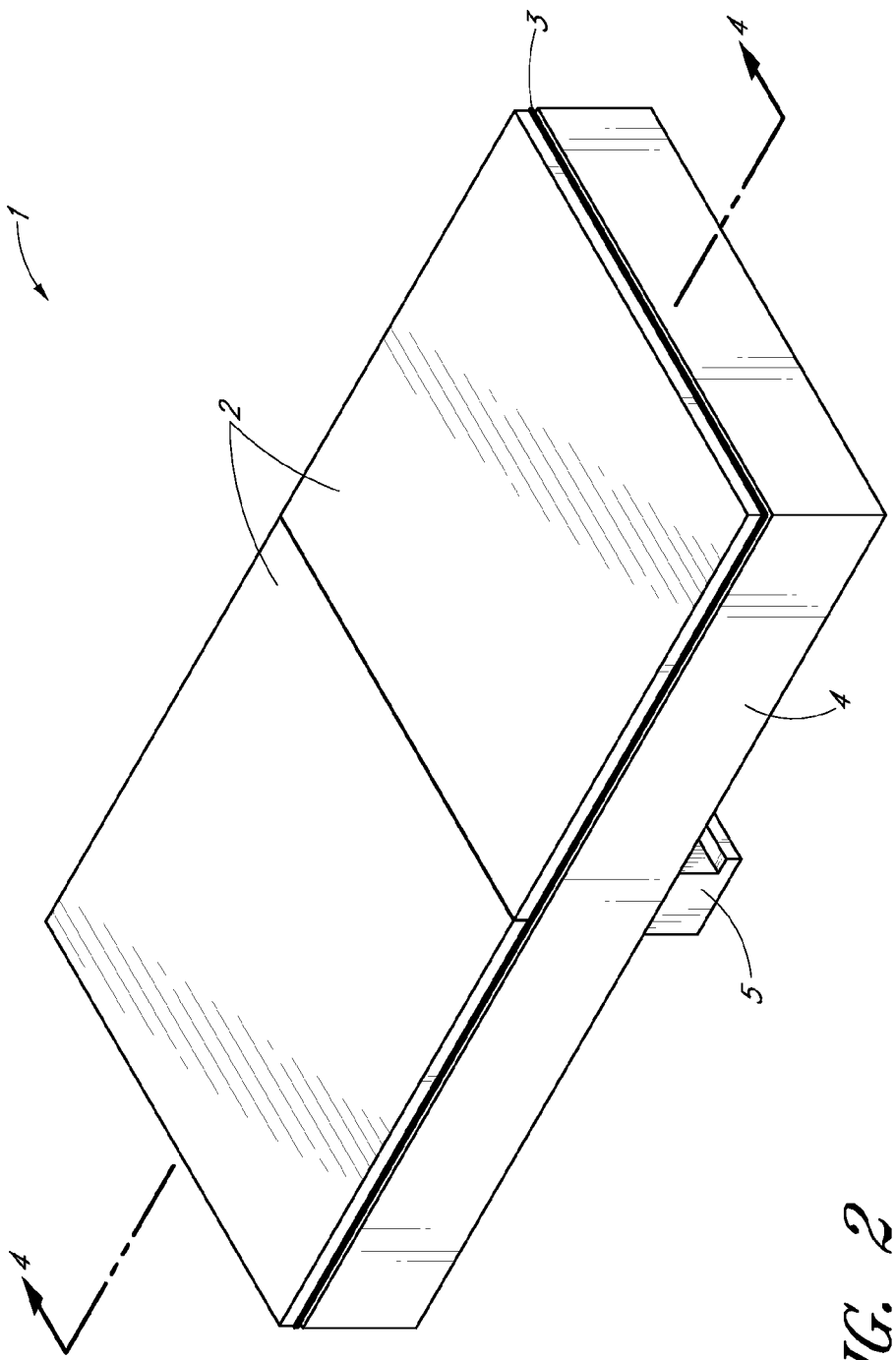
FIG. 2 is a perspective view of an assembled sensor module according to one embodiment.

Turning to FIG. 2, a perspective view of an example sensor module 1 is illustrated. The sensor module 1 can include one or more sensor dies 2 mounted on a sensor substrate 3. In some embodiments, the sensor die 2 can comprise an x-ray sensing device, including, e.g., a PDA or other imaging sensor. In x-ray applications, the module may also include a collimator and a scintillator array for converting the x-rays to visible light, or the collimator and scintillator can be separately provided over the module within the imaging system. In still other embodiments, the sensor die 2 can include any other suitable device configured to detect signals, including, e.g., MEMS sensors and other electrical and electronic sensors. Note that, although the sensor module 1 illustrates two sensor dies 2, in other embodiments, it is possible to only use one sensor die or greater than two sensor dies.

The sensor dies 2 are mounted on a sensor substrate 3. The sensor substrate 3 can be any suitable substrate, including a printed circuit board (PCB) or ceramic substrate. In the illustrated embodiment, the sensor substrate 3 is a flexible substrate with integrated bond pads, leads and traces, which allows for a low profile; however, in other embodiments, the sensor substrate can be substantially rigid. In various other embodiments, it is possible to use a leadframe-based substrate for the sensor substrate 3. The sensor substrate 3 can include multiple conductive leads configured to electrically couple to external devices or substrates. In some embodiments, the sensor die 2 can be mechanically and electrically coupled to the sensor substrate 3 by way of a gold thermocompression bond with an underfill epoxy. In other embodiments, the sensor die 2 can be soldered to the sensor substrate 3, while in yet other embodiments, the sensor die 2 can be coupled to the sensor substrate 3 using anisotropic conductive film (ACF) or non-conductive paste (NCP) technologies.

As noted, the illustrated sensor substrate 3 is a flexible substrate. Flexible substrates can be useful in arrangements where it is desirable for the substrate to conform to a particular geometry employed within a system. Flexible substrates can be made of a flexible plastic material, such as polyimide or PEEK and can include integrated bond pads, traces and leads similar to those used in conventional PCB substrate technologies. The flexible substrate can be easily bent or folded to conform to a particular geometry. The traces and leads can be patterned on the flexible substrate in very small dimensions. For example, in some embodiments, the traces can have line widths and spaces on the order of about 15 to 20 µm, and the leads or bond pads can have widths or diameters of about 200-300 µm with similar spacing, such that the pitch is on the order of 400-600 µm. By employing small lead pitch, it is possible for the sensor substrate to electrically communicate with a large number of pixels (e.g., corresponding to portions of the PDA), which can advantageously increase the resolution of the imaging device. In one embodiment, each sensor die 2 can include 512 pixels electrically coupled to the sensor substrate 3. In yet other embodiments, the line widths and spaces can be much smaller or larger, depending on the desired lead density for a particular arrangement.

Returning to FIG. 2, the sensor substrate 3 can be mounted on or coupled to a portion of a stiffener 4. As will be discussed in more detail below, the stiffener 4 can provide structural support for the sensor module 1. The stiffener 4 can also be made of a thermally insulating material (such as a plastic or ceramic) to thermally insulate the sensor die 2 and/or sensor substrate 3 from a processor die (not shown in FIG. 1). While not shown in FIG. 2, the sensor module 1 can also include a heat spreader 16 (illustrated in FIG. 3) coupled to the stiffener 4. The sensor module 1 can further comprise a connector 5 that is configured to electrically connect the sensor module 1 with the external control module 14 (FIG. 1). For example, the connector 5 can include various electrical contacts that are configured to electrically communicate signals received and/or processed within the sensor module 1 to the external control module 14. In some embodiments, a cable or other transmission element (e.g., transmission elements 15) can be used to electrically connect the connector 5 with the external control module 14.

Figure 3:
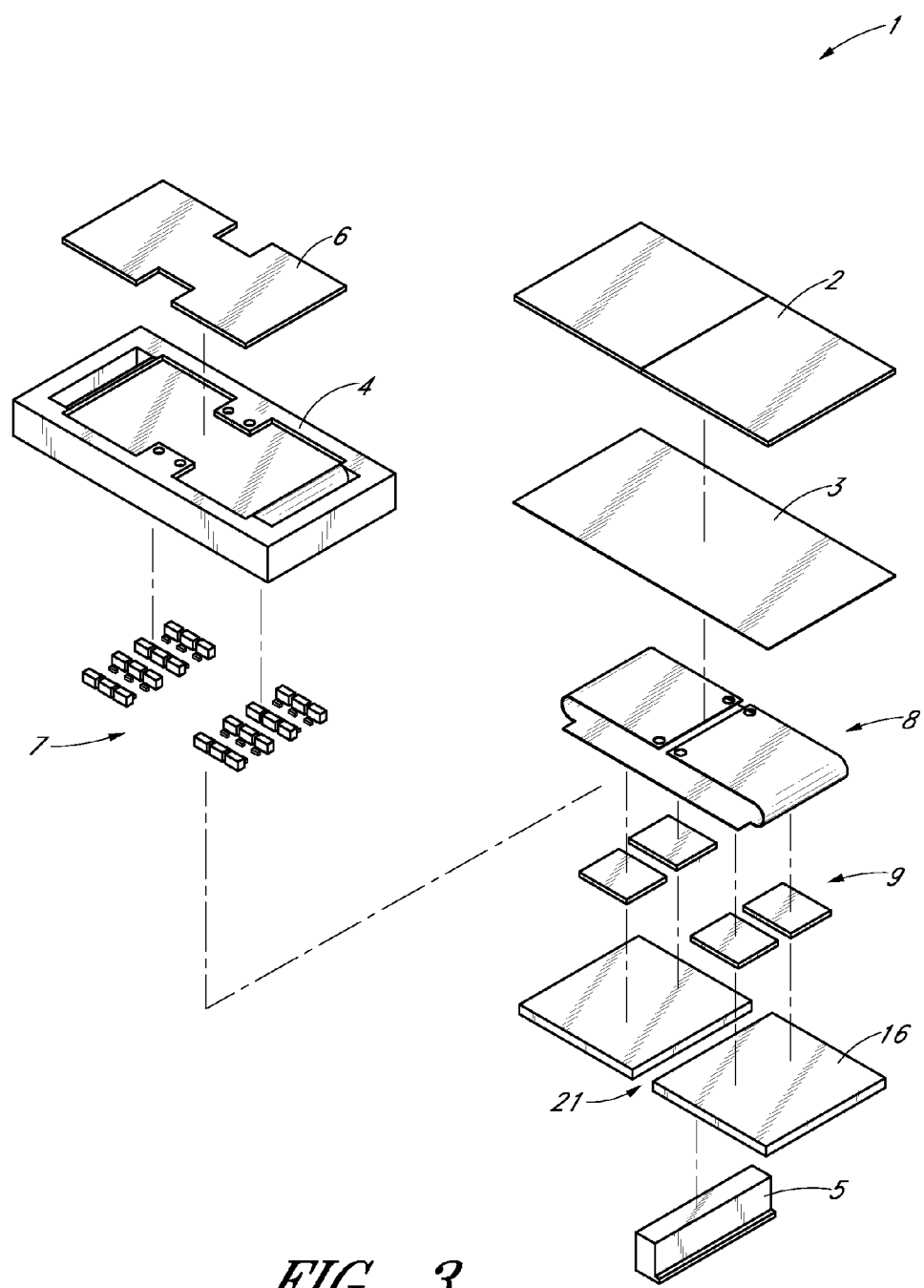
FIG. 3 is an exploded isometric view of the sensor module of FIG. 2.

FIG. 3 illustrates a 3D perspective exploded view of various components of the sensor module 1. As mentioned above, the sensor module 1 can include the sensor die 2 and the sensor substrate 3. The sensor module 1 can also include a flexible processor substrate 8, shown in a folded condition, and one or more processor dies 9 to be mounted on the flexible processor substrate 8. As will be described in more detail below, the flexible processor substrate 8 can include end portions that are bent at the edges of the stiffener 4 in order to space the dies 9 from the sensor substrate 3 while still making electrical contact to the sensor substrate 3. In addition, the sensor module 1 can include a radiation shield 6 coupled to one side of the stiffener 4. One or more passive electronic components 7 can be coupled to the flexible processor substrate 8. In the configuration illustrated in FIG. 3, the flexible processor substrate 8 is folded over the passive electronic components 7, the stiffener 4, and the shield 6, such that these components are positioned within the bent portions of the stiffener 4. Thus, after assembly (see FIG. 4), these components intervene between the die(s) 9 and the sensor substrate 3. The heat spreader 16 can be coupled to the stiffener 4, and the connector 5 can electrically connect to the flexible processor substrate 8 and/or other components by way of an opening 21 within the heat spreader 16. The opening 21 can be a through hole formed in the heat spreader 16. In some embodiments, the opening 21 can also be defined by a gap formed between two independent portions of the heat spreader 16, as shown. While FIG. 3 illustrates one example implementation of the sensor module 1, it should be appreciated that the particular ordering of components may vary in other implementations. For example, in some implementations, the shield can be positioned below the stiffener in FIG. 3, e.g., such that the shield is positioned between the stiffener and the flexible processor substrate.

Figure 5:
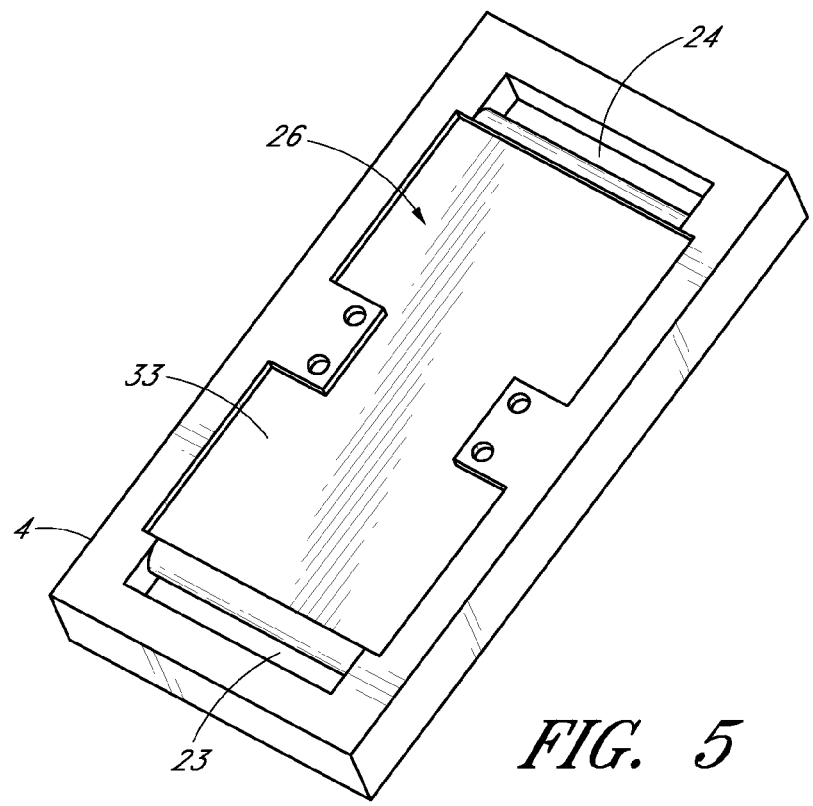
FIG. 5 is a top perspective view of a stiffener according to one embodiment.
Figure 6:
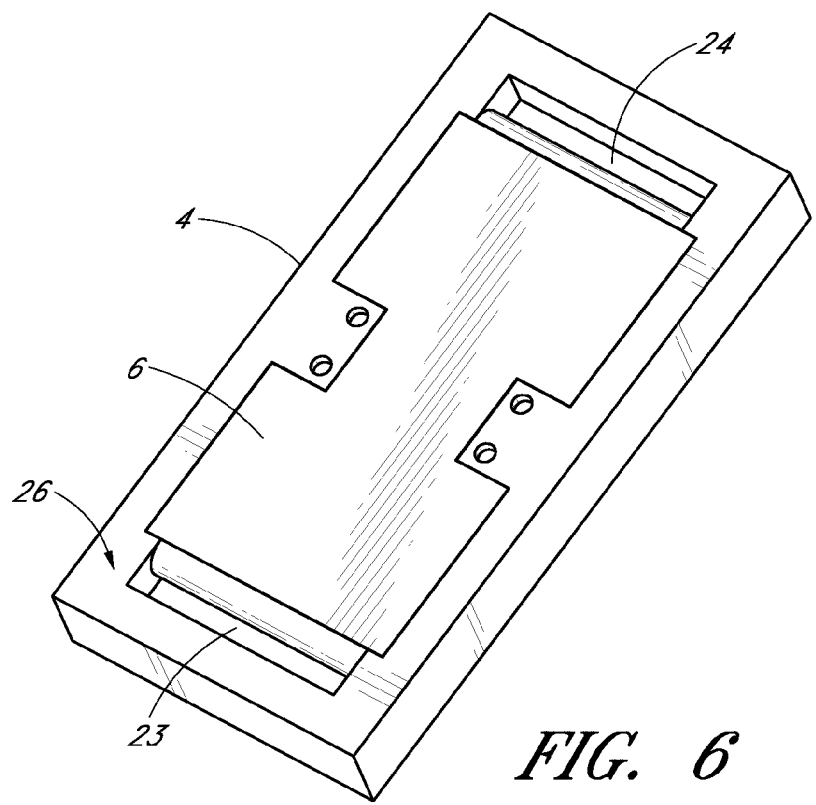
FIG. 6 is a top perspective view of a radiation shield attached to the stiffener of FIG. 5 according to one embodiment.

FIG. 4 illustrates a side cross-sectional view of the sensor module 1, and FIG. 4A illustrates an enlarged view of a portion of FIG. 4. Note that it may be helpful to refer to FIGS. 5-10 for reference to particular components when viewing FIGS. 4 and 4A. Turning to FIGS. 4-7, the stiffener 4 can be formed of any suitable thermally insulating material. For example, in some embodiments, the stiffener 4 can be formed of a rigid plastic material. The stiffener 4 can have a first or top side 26 and a second or bottom side 25 (FIG. 7) opposite the first side 26. As shown in FIGS. 4, 4A, and 5, the first side 26 can face the sensor substrate 3. The first side 26 of the stiffener 4 can include a first recess 33 sized and shaped to receive the shield 6 (FIG. 6). The stiffener 4 can also include a first aperture 23 and a second aperture 24. The first and second apertures 23, 24 can be shaped and sized to allow end portions of the flexible processor substrate 8 to pass through and electrically connect to the sensor substrate 3. In other arrangements, particularly where the sensor substrate is rigid, the apertures can be omitted in favor of a narrower stiffener, and the flexible processor substrate can bend around outside edges of the stiffener, rather than around internal edges as shown. The stiffener 4 can provide structural support for other components of the sensor module 1 and can also provide thermal insulation between the processor die 9 and the sensor die 2 and sensor substrate 3.

As shown in FIGS. 4, 4A, and 6, the shield 6 can be attached to the first side 26 of the stiffener 4. In some embodiments, the shield 6 can be housed within the first recess 33 formed in the first side 26 of the stiffener 4, so that the shield 6 is positioned between the stiffener 4 and the sensor substrate 3; in other arrangements, the shield can be positioned between the stiffener and the flexible processor substrate. The shield 6 can be a radiation shield configured to shield the processor die 9 from radiation impinging on the sensor module 1. For example, in embodiments that detect x-ray radiation, such as in CT devices, the shield 6 can shield the processor die 9 from x-ray radiation that may damage components in the processor or that otherwise may disrupt the operation of the processor die 9. In some embodiments, a tungsten (W) shield can be used to shield the processor die 9 from stray x-ray radiation received by the sensor die 2. In other embodiments, however, there may be no need for a shield, such as in embodiments that are not configured to sense x-ray radiation, e.g., an ultrasound device. In some implementations, the shield 6 can be attached to the first side 26 of the stiffener 4 using an adhesive material. In yet other embodiments, the shield can be positioned on the second side 25 of the stiffener 4.

Figure 7:
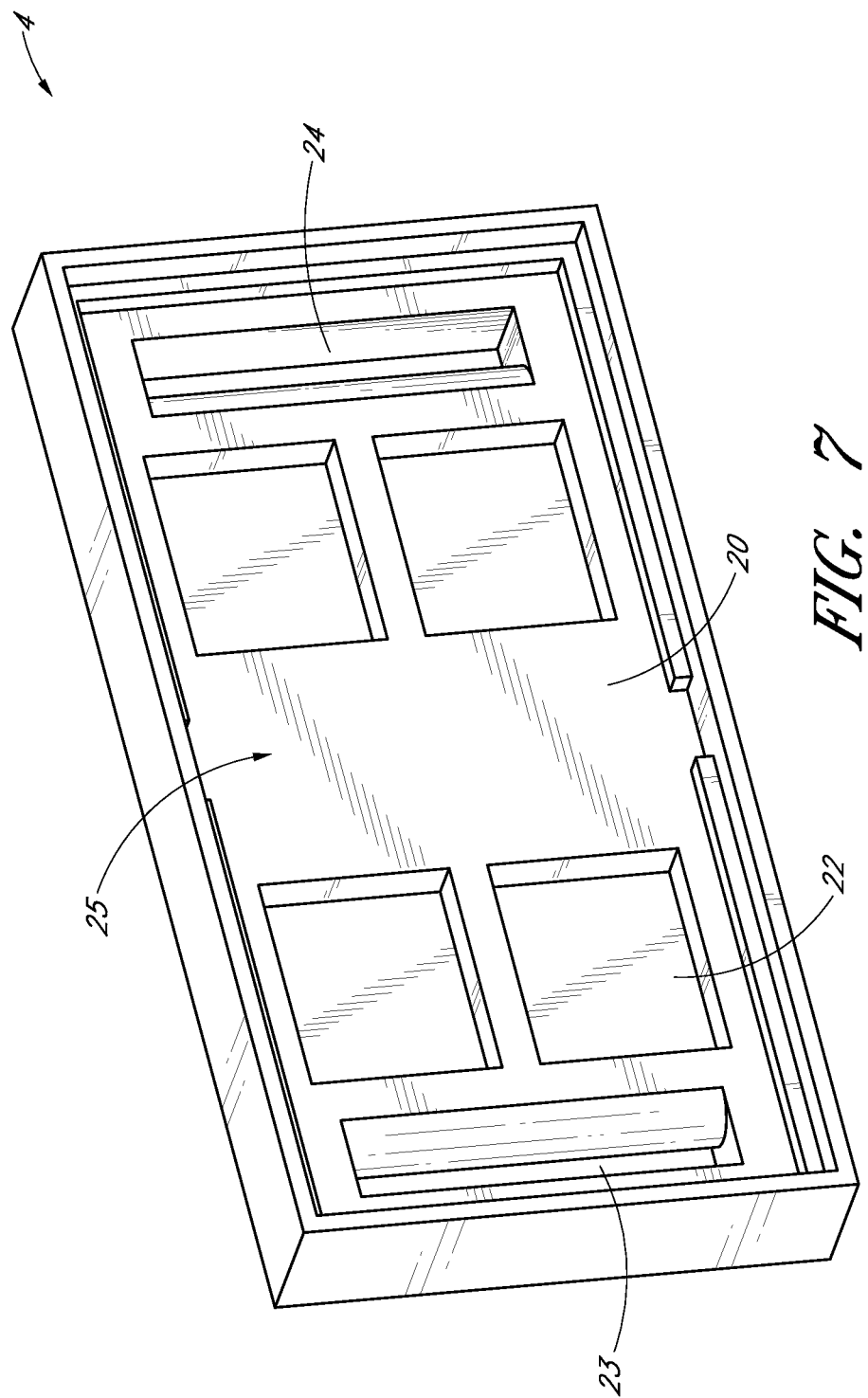
FIG. 7 is a bottom perspective view of the stiffener according to one embodiment.

FIG. 7 generally illustrates the second or bottom side 25 of the stiffener 4. The second side 25 of the stiffener 4 can include a second recess 20 formed in a relatively large area of the stiffener 4. One or more third recesses 22 can also be formed in the second side 25 of the stiffener 4. As illustrated in FIGS. 4A and 7, the third recess(es) 22 can be formed within the second recess 20. The third recess(es) 22 can be deeper than the second recess 20, but the third recess 22 can also be formed over an area that is smaller than the area over which the second recess 20 is formed. As will be appreciated below, the third recess(es) 22 can be shaped and sized to receive or accommodate the passive electronic components 7 (FIGS. 3-4A) attached to the flexible processor substrate 8. The second recess 20, in turn, can be shaped and sized to receive or accommodate the flexible processor substrate 8 and the processor die 9. In the assembly, the second recess 20 and the third recess 22 can be filled with air, which can act as a thermal insulator separating the processor die 9 and the sensor die 2.

Turning to FIGS. 4, 4A, 8, and 9, the flexible processor substrate 8, the processor die(s) 9, the passive electronic components 7, and the connector 5 are illustrated. At least one end of the processor substrate 8 is flexible such that it can be bent to conform to a desired geometry. The flexible processor substrate 8 can be made of a plastic material and can include multiple electrically conductive leads (not shown) configured to electrically couple to device dies and/or other substrates, as discussed above. The flexible processor substrate 8 shown in FIGS. 8 and 9 can include a central mounting portion 27, and a first end portion 18 and a second end portion 19 that extend from the central mounting portion 27.

Figure 8:
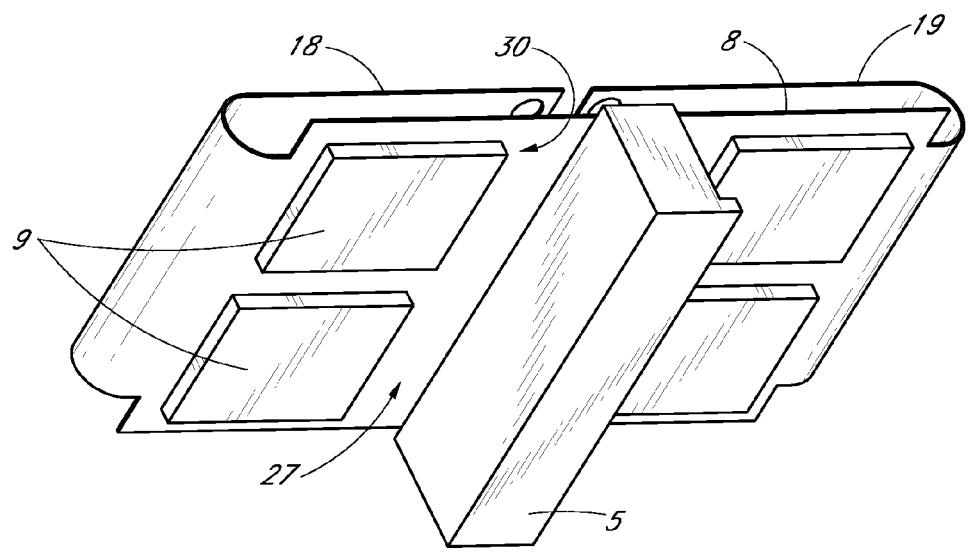
FIG. 8 is a bottom perspective view of a flexible processor substrate, multiple processor dies, and a connector, according to one embodiment.
Figure 9:
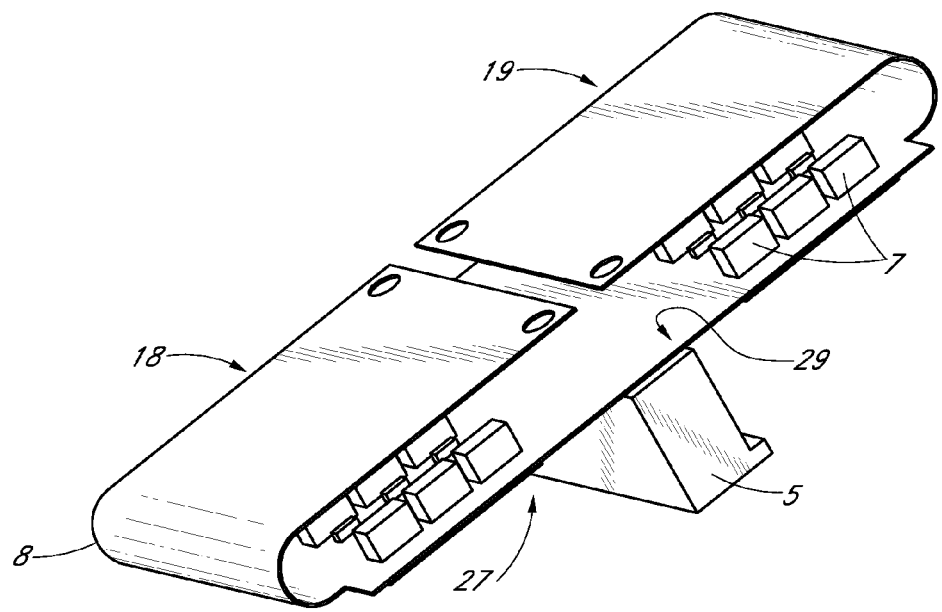
FIG. 9 is a top perspective view of multiple passive electronic components mounted on the flexible processor substrate, according to one embodiment.

While the illustrated flexible processor substrate has two end portions bent and electrically connected to the sensor substrate, in some embodiments, only one end portion can be bent around an edge of the stiffener and electrically connected to the sensor substrate. For example, FIGS. 8 and 9 illustrate four dies and two end portions folded around edges of the stiffener. In one implementation of FIGS. 8 and 9, e.g., the four dies can be mounted on one or two flexible processor substrates. In one embodiment, each of the two end portions is configured to electrically couple to 256 channels from the sensor and/or sensor substrate, for a total of 512 channels. In other embodiments, however, there may be only one or two dies, or fewer pin outs from the sensor die(s), and sufficient electrical connections can be made via only one end portion of the flexible substrate. For example, in some embodiments there may be only one or two processor dies mounted on one flexible processor substrate. In this case, only one end portion can be bent around an edge of the stiffener to electrically couple to the sensor substrate. In one implementation, the end portion can be configured to electrically couple to 256 channels. A skilled artisan would understand that various other electrical configurations are possible.

The central mounting portion 27, as referred to herein, can include pads and surfaces configured for mounting device dies, passive electronic components, and other electrical or electronic components. For example, as shown in FIGS. 8 and 9, the central mounting portion 27 of the flexible processor substrate 8 can include a first or top surface 29 and a second or bottom surface 30 opposite the first surface 29. As shown in FIG. 4, the first surface 29 can face the stiffener 4. The first surface 29 and the second surface 30 can both include leads or pads that can be used to electrically connect to dies and/or other electrical components. For example, as illustrated, the processor die(s) 9 can be electrically coupled to the second surface 30 of the central mounting portion 27. The processor die(s) 9 can be mounted to the flexible processor substrate 8 using a gold thermocompression bond with underfill epoxy. In other embodiments, the processor die 9 can be soldered to the flexible processor substrate 8, while in yet other embodiments, the processor die 9 can be coupled to the flexible processor substrate 8 using anisotropic conductive film (ACF) or non-conductive paste (NCP) technologies. The passive electronic components 7 can be mounted on the first surface 29 of the central mounting portion 27, using any suitable technique (including those used for coupling the processor die 9 to the central mounting portion 27). In some embodiments, the passive electronic components 7 can include, e.g., capacitors that can be used to improve the operation of the processor die 9. Other passive electronic components 7 can include resistors, inductors, and any other suitable components.

While the processor die 9 and the passive electronic components 7 have been illustrated as being mounted on opposing surfaces of the flexible processor substrate 8, it should be appreciated that the passive electronic components 7 can be mounted on the same surface as the processor die. For example, the passive electronic components 7 and the processor die 9 can both be mounted on the first surface 29 of the central mounting portion 27, or they can both be mounted on the second surface 30 of the central mounting portion 27. In other embodiments, the passive electronic components 7 can be mounted on the second surface 30, while the processor die 9 can be mounted on the first surface 29. Though four processor dies 9 are illustrated in FIGS. 8-9, it should be appreciated that any number of processor dies 9 can be used, including one, two, three or more dies. Moreover, while the processor die(s) 9 and the passive electronic components 7 have been mounted on the central mounting portion 27, it should be appreciated that components can also be formed on the other portions of the flexible processor substrate 8. Indeed, one advantage of using flexible substrate technology is that leads and internal conductive traces can still function even when the substrate is bent to conform to a desired geometry.

Returning to the embodiment illustrated in FIGS. 4 and 4A, the central mounting portion 27 of the flexible processor substrate 8 can be mounted to the second side 25 of the stiffener 4 using an adhesive, such as a thermally cured adhesive. In some embodiments, the central mounting portion 27 can be positioned within the second recess 20 formed in the second side 25 of the stiffener 4. A vacuum lamination process can be used in some implementations to attach the central mounting portion 27 to the stiffener 4. The thermally insulating stiffener 4 can therefore be disposed between the sensor substrate 3 and the central mounting portion 27 of the flexible processor substrate 8. The passive electronic components 7 can be housed within the third recess 22, which can remain filled with air or other thermally insulating material. Also, as shown, the processor die(s) 9, coupled to the second surface 30 of the central mounting portion 27, can be housed within the second recess 20 formed in the second side 25 of the stiffener 4. Air (or another thermally insulating material) can also fill the remainder of the second recess 20. In addition, in other implementations, a potting epoxy compound can be applied within the second recess 20 and/or the third recess 22. The potting epoxy can passivate the die(s) and can aid in securing the components housed within the recesses 20, 22.

In addition, as shown in FIGS. 4, 4A, 8, and 9, the first end portion 18 and the second end portion 19 of the flexible processor substrate 8 can be bent around the stiffener 4 to electrically couple to the sensor substrate 3. The first end portion 18 can be bent through the first aperture 23, while the second end portion 19 can be bent through the second aperture 24 formed in the stiffener 4. Note that in other embodiments, however, there may be no need for apertures 23, 24 in the stiffener 4. For example, in some embodiments, the first and second end portions 18, 19 can instead be bent around outer edges of the stiffener 4, rather than bent through apertures within the stiffener 4. In addition, in other embodiments, only one end portion may be bent around an edge of the stiffener, e.g., an outer edge or an internal edge of an aperture.

As shown in FIGS. 4 and 4A, the first end portion 18 and the second end portion 19 of the flexible processor substrate 8 can be folded over at least part of the first or top side 26 of the stiffener 4 and/or part of the shield 6. In some embodiments, the first end portion 18 and the second end portion 19 can attach to the first side 26 of the stiffener 4 and/or the shield 6 using a vacuum lamination process. In some implementations, a thermally cured adhesive can be used to mechanically couple the end portions 18, 19 to the stiffener 4 and/or the shield 6. The first and second end portions 18, 19 of the flexible processor substrate 8 electrically connect to the sensor substrate 3. In some embodiments, leads from the first and second end portions 18, 19 can be soldered to corresponding leads in the sensor substrate 3. In other embodiments, leads from the first and second end portions 18, 19 can electrically connect to corresponding leads in the sensor substrate 3 using non-conductive paste (NCP) or anisotropic conductive film (ACF) bonding technologies.

The first and second end portions 18, 19 can thereby provide electrical communication between the sensor die 2 (by way of the sensor substrate 3) and the processor die 9, by way of internal conductive traces connecting the pads on the first and second end portions 18, 19 with the central mounting portion 27 of the flexible processor substrate 8. The processor die 9 can therefore receive signals from the sensor die 2 and process them, e.g., convert analog signals into digital signals that can be transmitted to the external control module 14. The processor die 9 can also or alternatively perform other preprocessing or conditioning functions on the signal before transmission to the external control module 14. Because the processor die 9 is positioned near the sensor die 9, parasitic transmission losses can be minimized or substantially eliminated. For example, instead of transmitting analog signals from the sensor die 2 to the external control module 14 (FIG. 1), which can be located far away from the sensor die 2, the detected analog signals can be routed from the sensor die 2 to conductive traces within the sensor substrate 3. The signal can then couple to leads formed in the first and/or second end portions 18, 19 of the flexible processor substrate 8, which can then route the signal to the processor die 9 using traces within the flexible processor substrate 8. After analog-to-digital conversion, the processed digital signal can be transmitted, with minimal or no losses, a greater distance to the external control module 14 by way of the connector 5 and the transmission elements 15.

Figure 10:
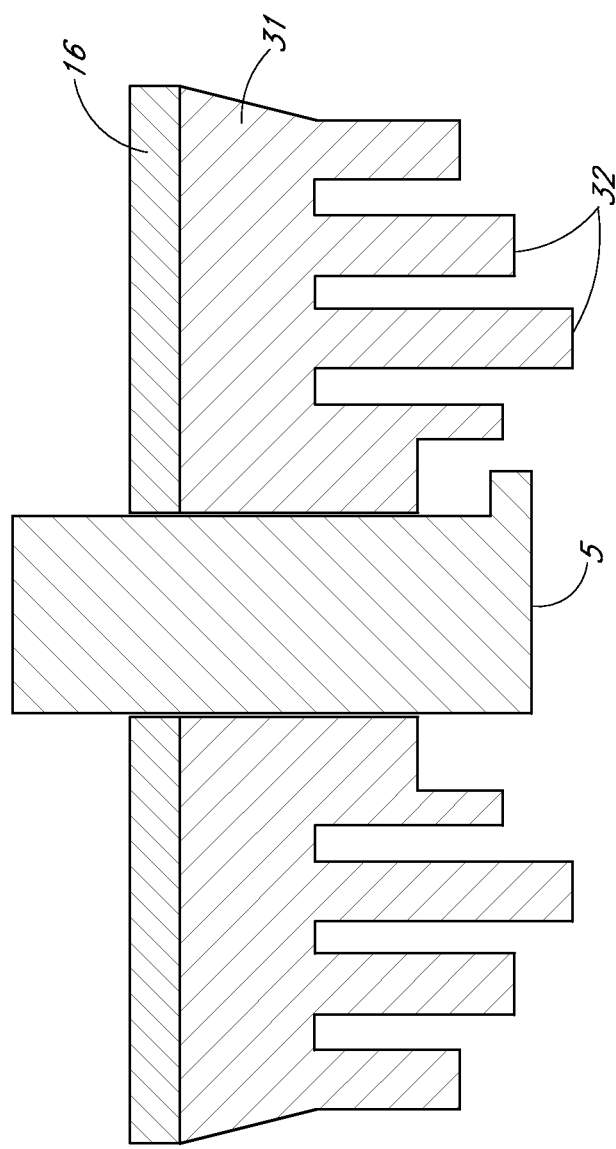
FIG. 10 is a side cross-sectional view of a heat spreader, an electronic connector, and a finned heat sink extending from the heat spreader.
Figure 11:
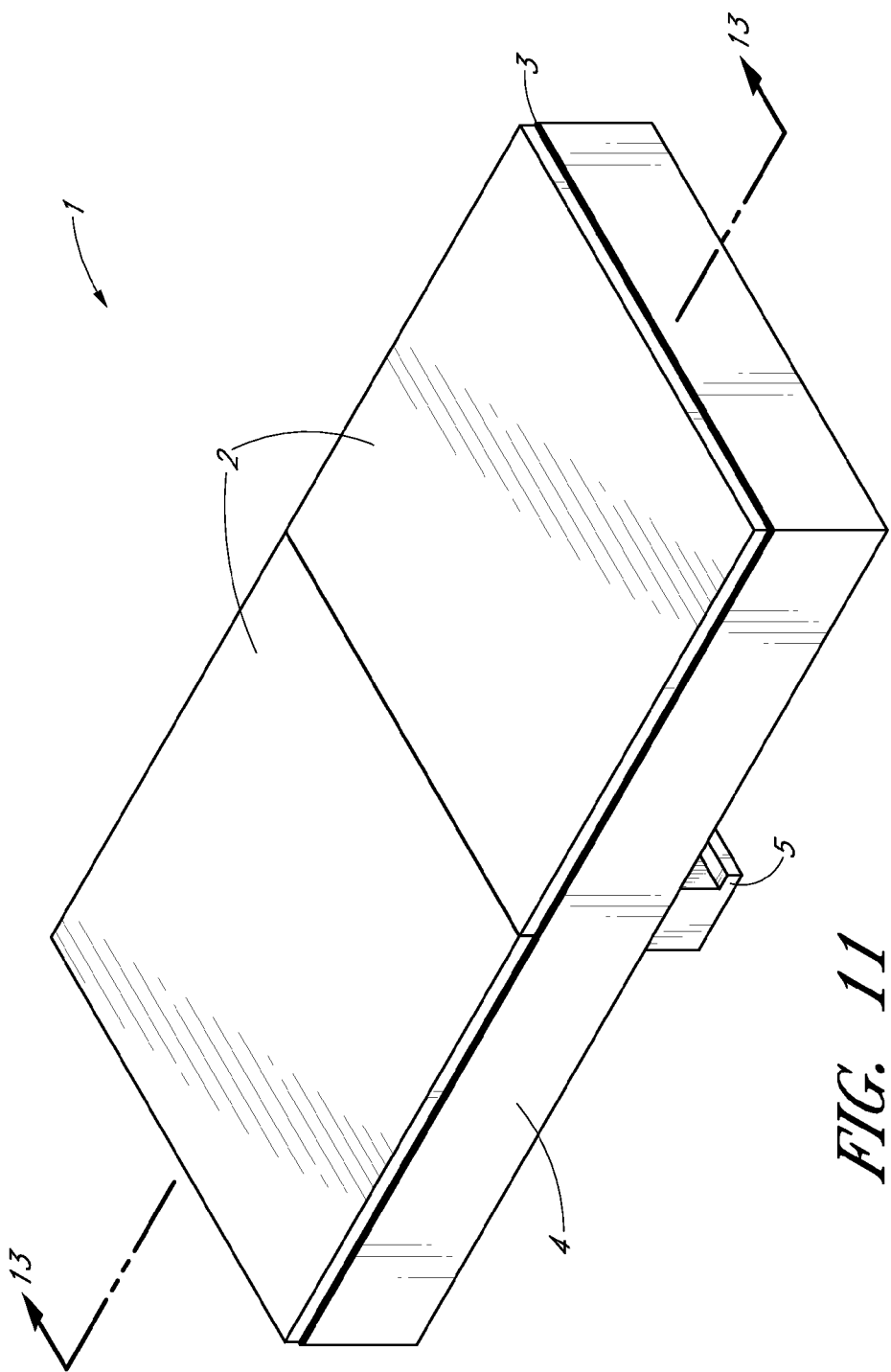
FIG. 11 is a top perspective view of an assembled sensor module according to another embodiment.
Figure 12:
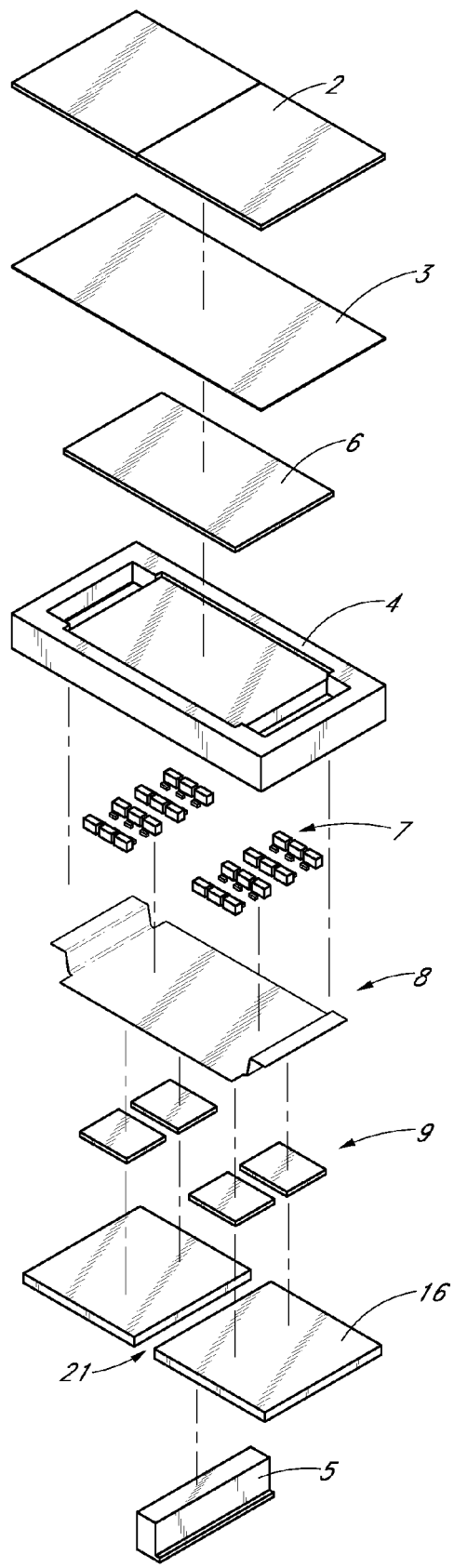
FIG. 12 is an exploded isometric view of the assembled sensor module of FIG. 11.
Figure 14:
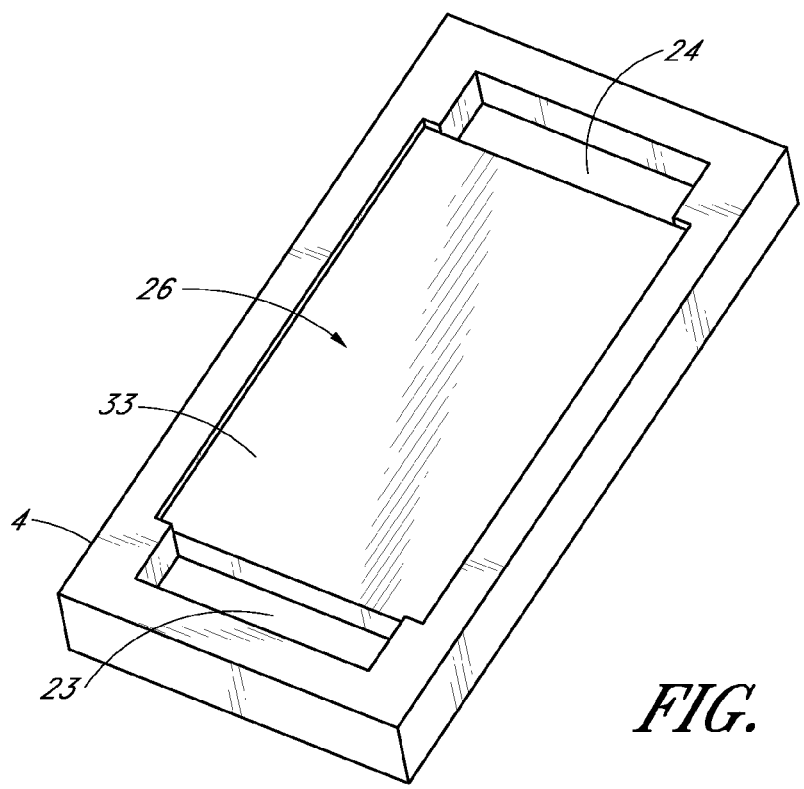
FIG. 14 is a top perspective view of a stiffener according to one embodiment.
Figure 15:
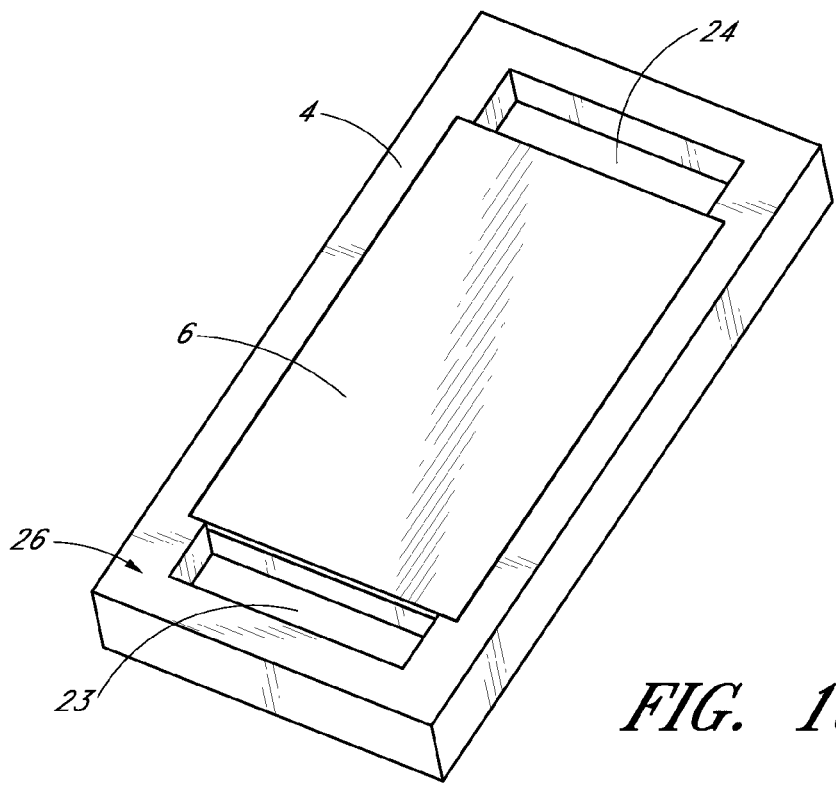
FIG. 15 is a top perspective view of a radiation shield attached to the stiffener of FIG. 14.
Figure 16:
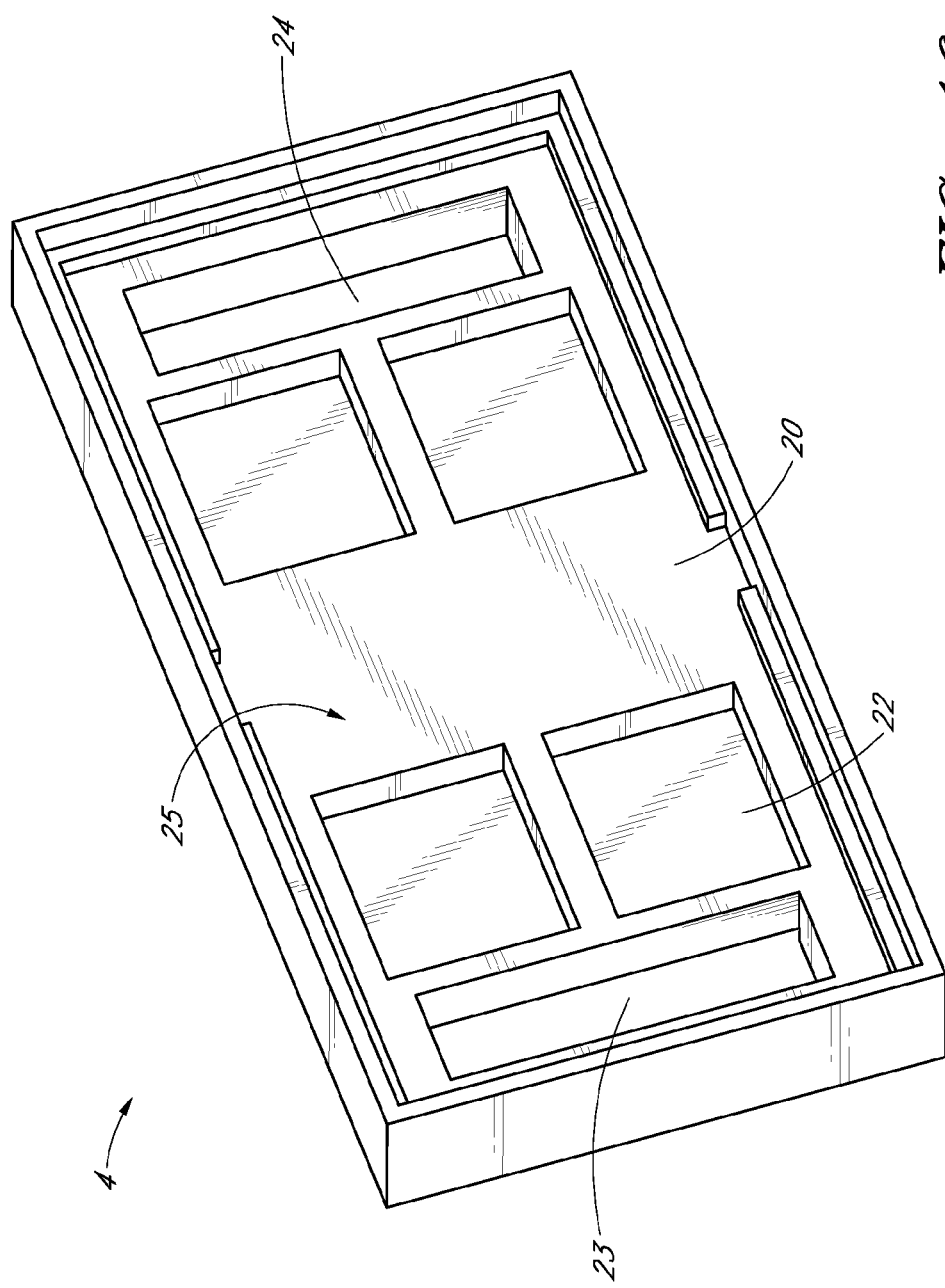
FIG. 16 is a bottom perspective view of the stiffener according to one embodiment.
Figure 17:
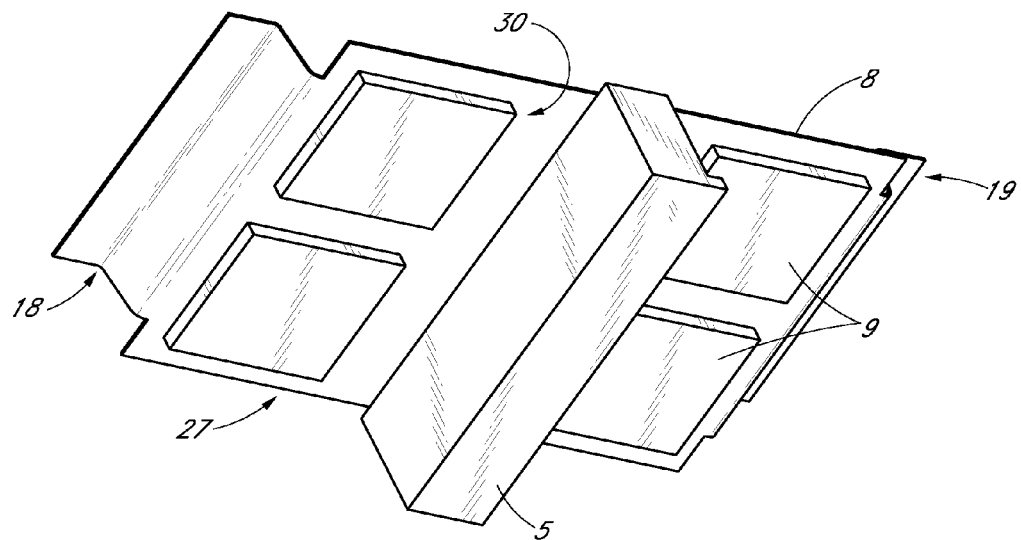
FIG. 17 is a bottom perspective view of a flexible processor substrate, multiple processor dies, and a connector, according to one embodiment.
Figure 18:
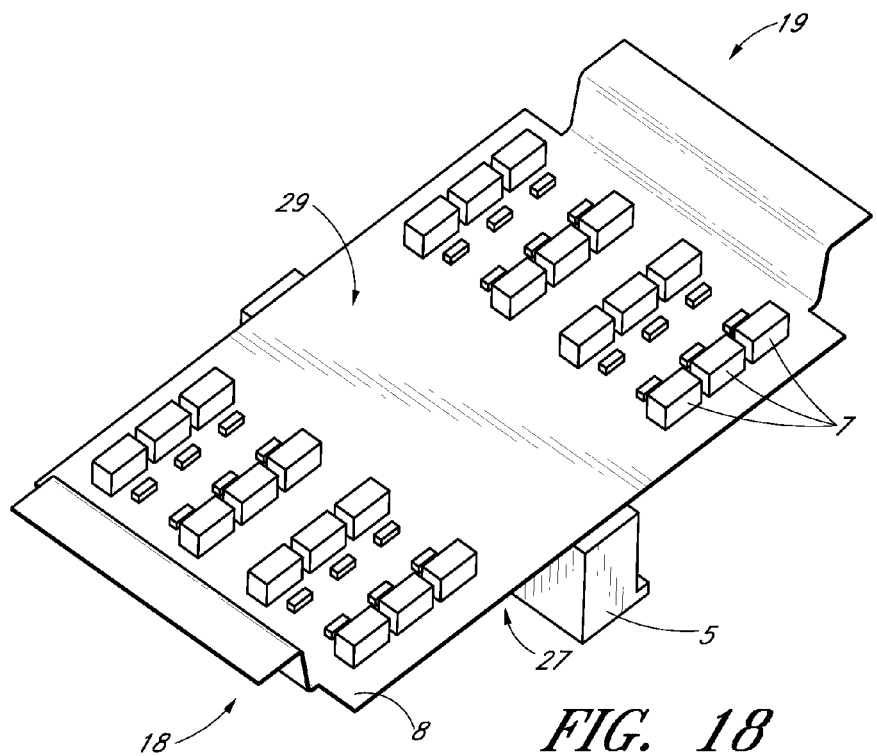
FIG. 18 is a top perspective view of multiple passive electronic components mounted on the flexible processor substrate of FIG. 17.

As mentioned above, while the proximity of the processor die 9 to the sensor die 2 can be advantageous for signal processing, the heat generated by the processor die 9 (and/or other associated electrical or electronic components) can damage the sensor die 2 if the heat is effectively conducted to the sensor die 2 and/or the sensor substrate 3. As shown in FIGS. 4 and 10, one way to conduct heat away from the processor die 9 and the sensor die 2 is to couple the heat spreader 16 to the second side of the stiffener 4. Note that while the heat spreader 16 of FIGS. 4 and 10 is illustrated as a substantially planar plate that couples to walls of the stiffener 4, in other embodiments, the heat spreader 16 can include walls extending into the sensor module 1 to couple to a recess or edge of the stiffener 4 (or other suitable structural component). The heat spreader 16 can be any suitable thermal conductor, such as a metal. The heat spreader 16 is positioned adjacent the processor die 9, which can enhance thermal conduction between the processor die 9 and the heat spreader 16. The processor die 9 can therefore be positioned between the heat spreader 16 and the stiffener 4. Furthermore, in some embodiments, thermal grease or another thermally conductive filler material can be applied within the gap between the processor die 9 and the heat spreader 16 to improve thermal conduction away from the processor die 9 and away from the sensor die(s) 2. In some embodiments, a heat sink 31 (FIG. 10) can be mounted on the heat spreader 16 to enhance conduction away from the processor die 9 and the sensor die 2. The heat sink 31 can include a plurality of fins 32 that increase the surface area of the heat sink 31 to allow heat to more rapidly dissipate into the air or surrounding environment. In other embodiments, there may not be a heat sink 31, in which case the thermal energy is allowed to dissipate directly into the air from the heat spreader 16. While the heat sink 31 can be formed as a separate component from the heat spreader 16, it should be appreciated that the heat spreader 16 can be integrated with the heat sink 31 such that an integrated heat sink/spreader is coupled to the second or bottom side 25 of the stiffener 4.

The embodiment of FIGS. 2-10 allows the processor die 9 to electrically couple to the sensor die 2 over a distance short enough to minimize transmission losses, while thermally insulating the sensor die 2 (and sensor substrate 3) from heat generated by the processor die 9 that can potentially damage the sensor die 2 and/or sensor substrate 3. At the same time, the illustrated module assembly has a very low overall profile, e.g., a thickness of less than about 10 mm from the sensor die(s) to the heat spreader 16, preferably between about 3 mm and about 6 mm. For example, in the illustrated embodiment without the heat sink, the thickness is between about 4 mm and about 5 mm, particularly about 4.6 mm. As shown best in FIG. 4, in one embodiment, one or more thermally insulating components can separate the processor die 9 from the sensor substrate 3 and the sensor die 2. For example, the thermally insulating stiffener 4 is positioned between the processor die 9 and the sensor substrate 3, which can effectively impede heat transfer to the sensor substrate 3 and sensor die 2. Moreover, the air (or other thermally insulating material in some embodiments) filling the second recess 20 and the third recess 22 can assist in thermally insulating the processor die 9 from the sensor die 2 and the sensor substrate 3. And, even though the flexible processor substrate 8 and the shield 6 may include conductive components, these components nevertheless physically separate the processor die 9 from the sensor die 2 and the sensor substrate 3. Therefore, by being positioned between the processor die 9 and the sensor substrate 3 (and the sensor die 2), the thermally insulating stiffener 4 and the air or other insulating material can substantially inhibit the flow of thermal energy (e.g., heat flow) from the processor die 9 to the sensor die 2 and/or the sensor substrate 3.

In addition to the thermally insulating components separating the processor die 9 from the sensor die 2 and/or the sensor substrate 3, the sensor module 1 can also include thermally conductive components on the other side of the processor die 9. The thermally conductive components can enhance the transfer of thermal energy away from sensor die 2 and the sensor substrate 3, and toward the heat sink 31 (or directly to the surrounding environment in embodiments without a heat sink). For example, the thermally conductive heat spreader 16 in the illustrated embodiments can be positioned adjacent the processor die 9 and can therefore effectively conduct heat from the processor die 16 in a direction away from the sensor die 2 and the sensor substrate 3. Moreover, in some embodiments, thermally conductive grease or other conductive filler material can be applied between the processor die 9 and the heat spreader 16, and/or in gaps between the heat spreader 16 and the flexible processor substrate 8. The thermally conductive filler material can assist in transferring heat away from the processor die 9 and toward the heat spreader 16. Consequently, in some embodiments, the conductive heat spreader 16 and/or the conductive filler material can conduct heat away from the sensor die 2, while the insulating materials (e.g., the stiffener 4 and the air gaps formed in recesses 20, 22) can impede the flow of heat in the direction of the sensor die 2 and sensor substrate 3. Thus, the disclosed configuration can create a thermal pathway that ensures that most of the heat generated by the processor die 9 will be transferred away from the sensor 2 and/or sensor substrate 3. However, it should be appreciated that in some embodiments, the stiffener 4 alone can provide sufficient thermal insulation to thermally separate the processor die 9 from the sensor die 2 and the sensor substrate 3.

FIGS. 11-18 illustrate another embodiment of the sensor module 1. In general, like reference numerals denote parts similar to those disclosed in FIGS. 1-10. In addition, some of the structure of the sensor module disclosed in FIGS. 11-18 can be the same as those in FIGS. 1-10, except where noted herein. For example, unlike in FIGS. 1-10, the first and second end portions 18, 19 of the flexible processor substrate 8 are not folded over the first side 26 of the stiffener 4 in the embodiments of FIG. 11-18. Instead, as illustrated in FIGS. 12, 13, and 17-18, the first and second end portions 18, 19 of the flexible processor substrate 8 are bent at an edge of the stiffener 4 (e.g., an internal edge at first and second apertures 23, 24) and electrically couple to the sensor substrate 3 without folding over the first side 26 of the stiffener 4. Even though the configuration of FIGS. 11-18 are different from those of FIGS. 2-10, the illustrated embodiments can likewise improve signal processing by locating the processor die 9 near the sensor die 2 and providing a very low overall profile, while thermally insulating the processor die 9 from the sensor die 2 and/or the sensor substrate 3.

Figure 19A:
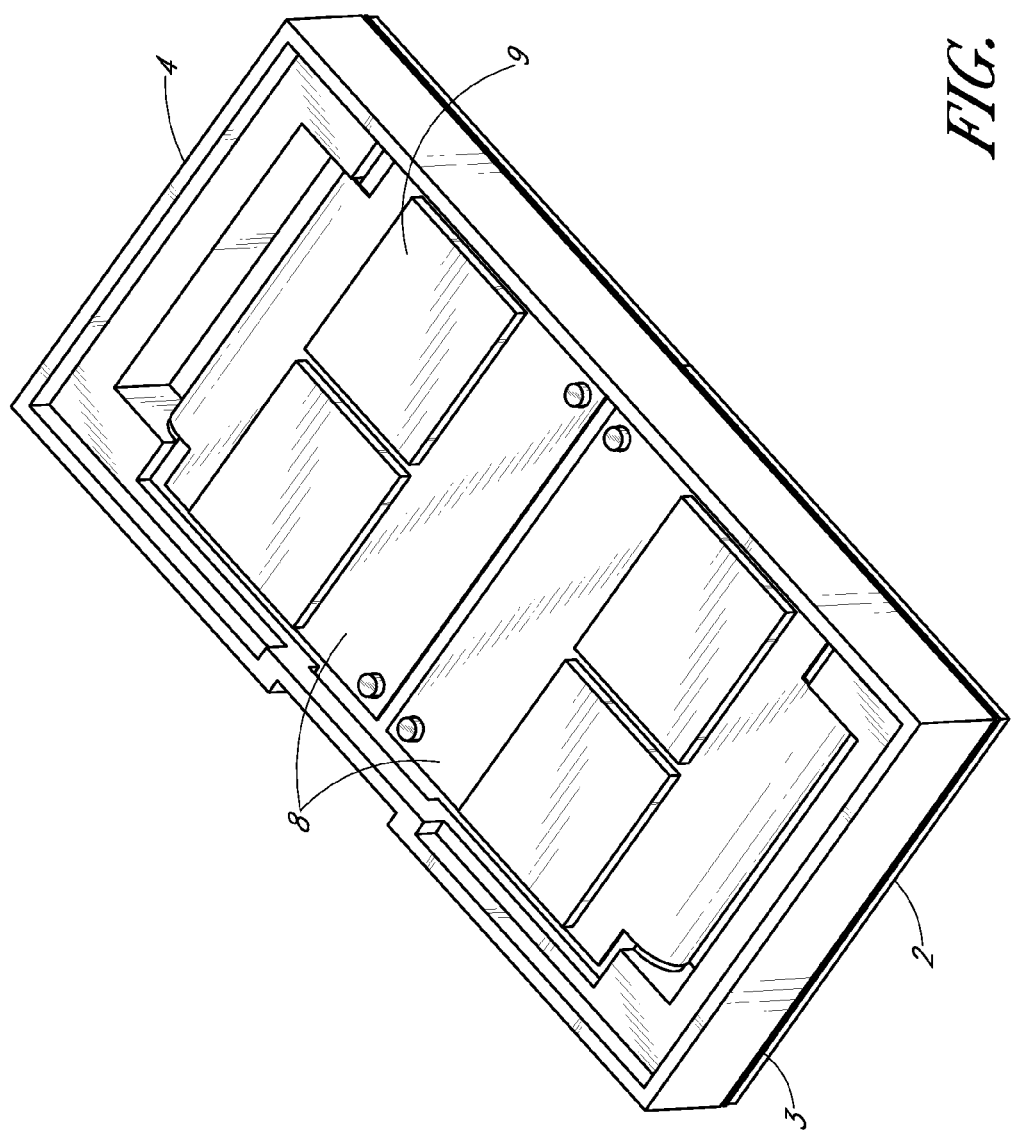

FIGS. 19A-D illustrate another embodiment of various components of a sensor module 1. As above, like reference numerals denote parts similar to those disclosed in FIGS. 1-18. Unlike the single flexible processor substrate 8 illustrated in, e.g., FIG. 3, FIG. 19A illustrates an embodiment having two flexible processor substrates 8 separated within the stiffener 4. While only two flexible processor substrates 8 are illustrated in FIG. 19A, it should be appreciated that more than two flexible processor substrates 8 (e.g., 3, 4, or more) may be provided within the sensor module 1.

Furthermore, as shown in FIG. 19B, a pigtail connector 57 can be used to electrically connect the sensor module 1 to the external control module 14 (or other external systems). The pigtail connector 57 of FIG. 19B, for example, is mechanically and electrically coupled to the flexible processor substrates 8 using any suitable technique. For example, the pigtail connector 57 can be soldered to the flexible processor substrates 8, or the pigtail connector can be coupled to the flexible processor substrates 8 using NCP or ACF technologies, as discussed above. As shown in FIG. 19B, the pigtail connector 57 can be mounted to span and electrically connect to both flexible processor substrates 8 and can exit the stiffener 4 at a first outer edge 58 of the stiffener 4.

Figure 19C:
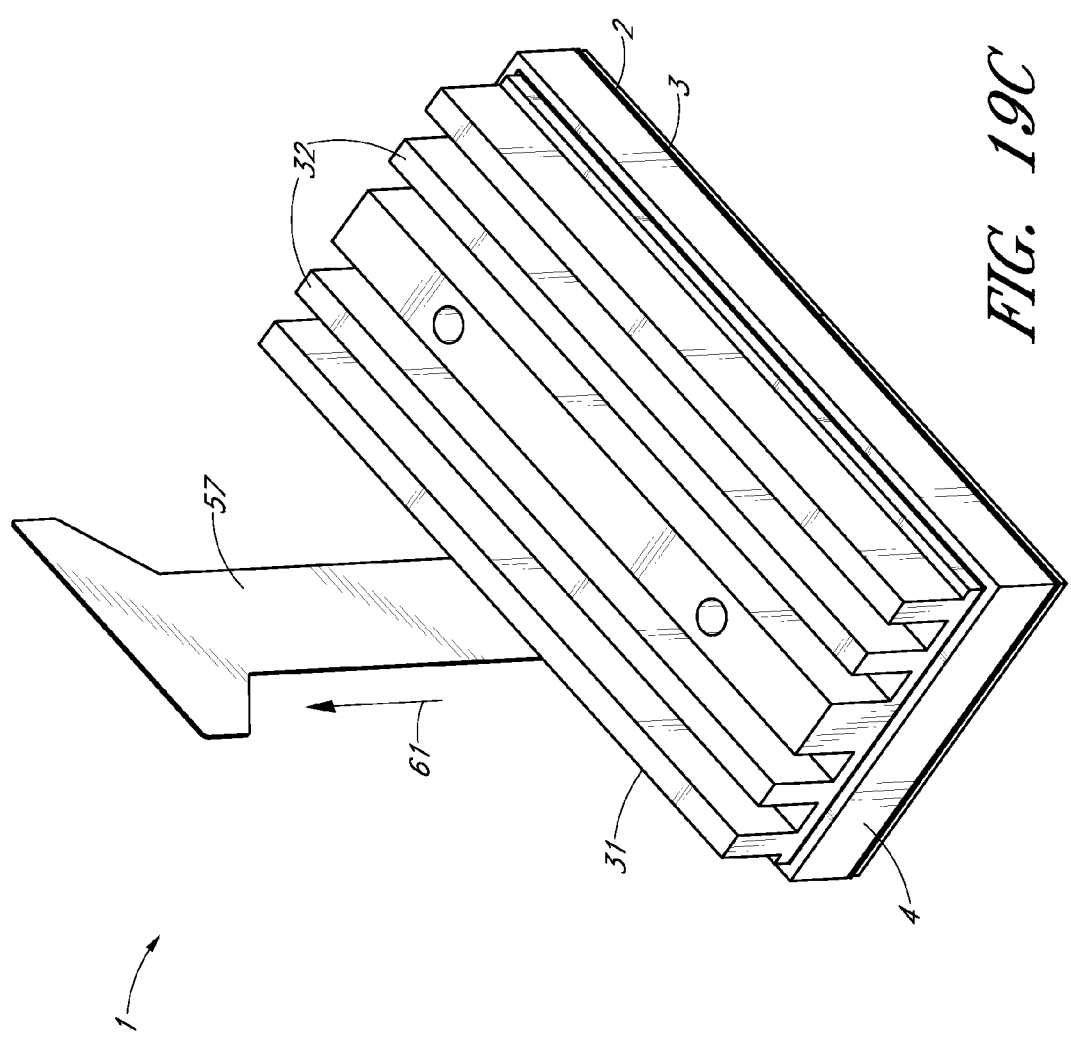

FIGS. 19C and 19D illustrate various implementations of the heat spreader 16 and the heat sink 31. In FIG. 19C, a finned heat sink 31 having multiple fins 32 is coupled to the second or bottom side 25 of the stiffener 4. In FIG. 19D, a heat spreader 16 is shown coupled to the stiffener 4 without a heat sink. As mentioned above, the heat spreader 16 can be integrated with the heat sink 31 to form a single component, or the heat spreader 16 can be formed as a separate component from the heat sink 31. In the illustrated embodiments of FIGS. 19C and 19D, the pigtail connector 57 extends from the first outer edge 58 of the stiffener 4 and extends away from the sensor module 1 in a direction 61 parallel to the thickness of the module 1. Unlike the connector 5 (which is illustrated as being mounted through an opening in the center of the heat spreader and/or heat sink), therefore, the pigtail connector 57 can be oriented out of the path that conducts heat away from the processor and sensor dies. The configuration of FIGS. 19A-D can thereby further improve the thermal properties of the sensor module 1.

Figure 20:
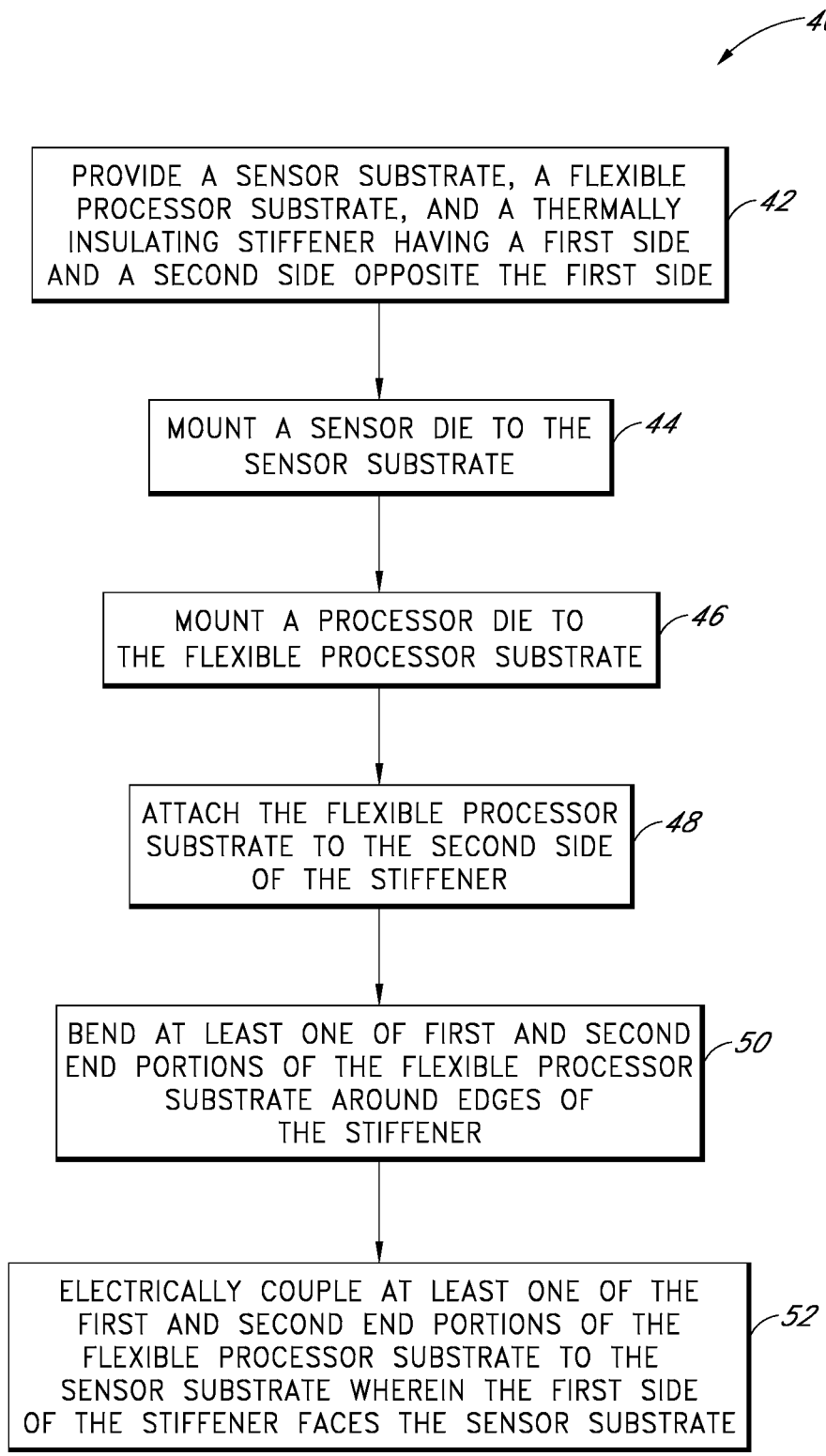
FIG. 20 is a flowchart illustrating one method for assembling a compact sensor module.

Turning to FIG. 20, one method 40 for forming a compact sensor module is shown. The skilled artisan will readily appreciate that the steps need not be performed in the sequence illustrated. In Block 42, a sensor substrate, a flexible processor substrate, and a thermally insulating stiffener are provided. The sensor substrate can be any suitable sensor substrate, including a PCB or ceramic substrate. The sensor substrate can also be formed of a flexible substrate material to reduce module profile relative to, e.g., use of PCB. The flexible processor substrate is a flexible substrate and can have multiple electrical leads configured to electrically couple to device dies and/or other substrates. The stiffener can be, e.g., a plastic stiffener having a first side and a second side opposite the first side.

A sensor die can be mounted to the sensor substrate in Block 44. As above, the sensor die can be any suitable sensor die, including, e.g., an x-ray sensing device that may further include a photo detector array (PDA) or other imaging sensor. In other embodiments, the sensor die 2 can include any other suitable device configured to detect signals, including, e.g., MEMS sensors and other electrical and electronic sensors. Moreover, the sensor die can be mechanically and electrically coupled to the sensor substrate by way of a gold thermocompression bond with an underfill epoxy, or by using NCP or ACF bonding technologies.

Turning to Block 46, a processor die is mounted to the flexible processor substrate. The processor die can comprise a general processor or an Application-Specific Integrated Circuit (ASIC) processor. A particular example includes an analog-to-digital converter (ADC). The processor die can be bonded to the flexible processor substrate by any suitable mechanism, including the thermocompression, ACF, and NCP bonding technologies mentioned above.

In Block 48, the flexible processor substrate is attached to the second side of the stiffener. As described in detail above, a central mounting portion of the flexible processor substrate can be attached to the second side of the stiffener, such as within a recess formed in the second side of the stiffener. The flexible processor substrate can be attached to the stiffener in any suitable manner, including using a thermally curable adhesive material.

In Block 50, at least one of first and second end portions of the flexible process substrate can be bent around the edges of the stiffener. As described above, the first and second end portions can extend from the central mounting portion. In some implementations, the first and second end portions can be bent around outer edges of the stiffener. In other embodiments, however, the first and second end portions can be bent around internal edges of the stiffener, e.g., through first and second apertures formed through the stiffener. The first and second end portions can be further folded over the first side of the stiffener.

At least one of the first and second end portions of the flexible processor substrate can be electrically coupled to the sensor substrate in Block 52. The first side of the stiffener can face the sensor substrate. In some embodiments, one or both of the first and second end portions can be soldered to the sensor substrate, while in other embodiments, ACF or NCP technologies can be used to electrically connect the flexible processor substrate to the sensor substrate. Additionally, where fewer connections are needed, electrical connections can be made exclusively at one of the end portions, and the other end portion need not be bent around an edge of the stiffener.

Furthermore, a radiation shield can be mounted to the first side of the stiffener between the stiffener and the sensor substrate in some embodiments. For example, the shield can be mounted within a recess formed in the first or top side of the stiffener, nearest to the sensor die(s). The shield can be bonded to the stiffener using an adhesive in some implementations. Moreover, the sensor substrate can also be attached to the shield and/or to the first side of the stiffener using an adhesive or other bonding technique. To enhance heat transfer away from the sensor die, a heat spreader can be attached to the second or bottom side of the stiffener adjacent the processor die. The processor die can therefore be positioned between the stiffener and the heat spreader. To enhance thermal conductivity between the processor die and the heat spreader, a thermally conductive grease or filler material can be applied between the processor die and the heat spreader. In addition, a connector can be electrically coupled to the flexible processor substrate through an opening in the heat spreader. The connector can provide electrical communication between the sensor module and an external control module. Further, passive electrical components, such as capacitors, can be electrically coupled to the flexible processor substrate to assist the processor in processing the detected signals. While certain steps of the method 40 have been presented in a particular order, it should be appreciated that the steps can be performed in any other suitable order.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A sensor module comprising:
 a first substrate and a second substrate;
 a sensor die in electrical communication with the first substrate and the second substrate;
 a processor die in electrical communication with the first substrate and the second substrate; and
 a stiffener having a first side and a second side opposite the first side,
 wherein the first and second sides of the stiffener include major surfaces of the stiffener, the stiffener disposed between the sensor die and the processor die such that the first side faces the sensor die and a first normal line passes perpendicularly through the major surface of the first side and intercepts the sensor die, and such that the second side faces the processor die and a second normal line passes perpendicularly through the major surface of the second side and intercepts the processor die,
 wherein one of the first and second substrates includes a bent portion and a mounting portion extending from the bent portion, the bent portion folded around an edge of the stiffener to electrically couple the sensor die and the processor die, and wherein the processor die is directly mounted to one of the first and second substrates and the sensor die is mounted over the other of the first and second substrates, and
 wherein the stiffener is further disposed between a first portion of the first substrate and a second portion of the second substrate, such that the first normal line intercepts one of the first portion and the second portion and the second normal line intercepts the other of the first portion and the second portion.

2. The sensor module of claim 1, wherein the second substrate includes the bent portion and the mounting portion, wherein the processor die is mounted to the mounting portion of the second substrate, and wherein an end portion of the second substrate extends from the bent portion opposite the stiffener from the mounting portion to electrically connect to the first substrate.

3. The sensor module of claim 2, wherein the mounting portion of the second substrate is coupled to the second side of the stiffener.

4. The sensor module of claim 3, wherein the mounting portion of the second substrate has a first surface facing the stiffener and a second surface opposite the first surface, and wherein the processor die is mounted on the second surface of the mounting portion.

5. The sensor module of claim 4, further comprising a plurality of passive electrical components electrically coupled to the first surface of the mounting portion of the second substrate and positioned within at least one recess formed in the second side of the stiffener.

6. The sensor module of claim 1, wherein the second substrate includes the bent portion and the mounting portion, and wherein first and second opposite end portions of the second substrate bend around edges of the stiffener to electrically connect to the first substrate.

7. The sensor module of claim 1, wherein the second substrate includes the bent portion and the mounting portion, and wherein a first end portion of the second substrate is bent through a first aperture formed in the stiffener to electrically communicate with the first substrate.

8. The sensor module of claim 7, wherein the first end portion is folded over at least part of the first side of the stiffener.

9. The sensor module of claim 1, further comprising a radiation shield coupled with the first side of the stiffener.

10. The sensor module of claim 9, wherein the radiation shield is housed within a recess formed in the first side of the stiffener.

11. The sensor module of claim 1, wherein the sensor die comprises an image sensor die.

12. The sensor module of claim 11, wherein the sensor die comprises a photodiode array.

13. An imaging device comprising an array of multiple sensor modules, each sensor module in the array comprising the sensor module of claim 1.

14. The imaging device of claim 13, wherein the imaging device is a CT device.

15. A sensor module comprising:
a first substrate and a second substrate;
a sensor die in electrical communication with the first substrate and the second substrate;
a processor die in electrical communication with the first substrate and the second substrate; and
a stiffener having a first side and a second side opposite the first side, wherein one of the first and second substrates includes a bent portion and a mounting portion extending from the bent portion, the bent portion folded around an edge of the stiffener to electrically couple the sensor die and the processor die, wherein a first segment of one of the first and second substrates is disposed along the first side of the stiffener and a second segment of one of the first and second substrates is disposed along the second side of the stiffener, wherein the processor die is directly mounted to one of the first and second substrates and the sensor die is mounted over the other of the first and second substrates, and
wherein the stiffener is further disposed between a first portion of the first substrate and a second portion of the second substrate, such that the first portion includes one of the first segment and the second segment and the second portion includes the other of the first segment and the second segment.

16. The sensor module of claim 15, wherein the second substrate includes the bent portion and the mounting portion, wherein the processor die is mounted to the mounting portion of the second substrate, and wherein an end portion of the second substrate that extends from the mounting portion is bent around the edge of the stiffener to electrically connect to the first substrate.

17. The sensor module of claim 16, wherein the stiffener is disposed between the first substrate and the mounting portion of the second substrate.

18. The sensor module of claim 17, wherein the first and second sides of the stiffener include major surfaces of the stiffener, the stiffener disposed between the first substrate and the mounting portion of the second substrate such that the first side faces the first substrate and a first normal line passes perpendicularly through the major surface of the first side and intercepts the first substrate, and such that the second side faces the mounting portion of the second substrate and a second normal line passes perpendicularly through the major surface of the second side and intercepts the mounting portion of the second substrate.

19. A sensor module comprising:
a first substrate and a second substrate;
a sensor die in electrical communication with the first and second substrates;
a processor die in electrical communication with the first and second substrates; and
a stiffener having a first side including a recess formed therein and a second side opposite the first side, wherein one of the first and second substrates is bent around an edge of the stiffener to electrically couple the sensor die and the processor die, wherein a first segment of one of the first and second substrates is disposed along the first side of the stiffener and a second segment of one of the first and second substrates is disposed along the second side of the stiffener, wherein the stiffener is further disposed between a first portion of the first substrate and a second portion of the second substrate; and
a radiation shield disposed in the recess of the first side of the stiffener.

* * * * *